United States Patent [19]
Takahashi

[11] Patent Number: 5,883,847
[45] Date of Patent: Mar. 16, 1999

[54] SEMICONDUCTOR MEMORY DEVICE CAPABLE OF REDUCING POWER SUPPLY NOISE CAUSED BY OUTPUT DATA THEREFROM

[75] Inventor: Mariko Takahashi, Tokyo, Japan

[73] Assignee: NEC Corporation, Tokyo, Japan

[21] Appl. No.: 890,378

[22] Filed: Jul. 11, 1997

[30] Foreign Application Priority Data

Jul. 11, 1996 [JP] Japan ................................ 8-181934

[51] Int. Cl.$^6$ ........................................... G11C 7/02
[52] U.S. Cl. .................. 365/208; 365/206; 365/228; 365/233.5; 365/189.05; 365/194
[58] Field of Search .................... 365/206, 208, 365/228, 233.5, 189.05, 194

[56] References Cited

U.S. PATENT DOCUMENTS 4,802,127  1/1989  Akaogi et al. ..................... 365/189.05

FOREIGN PATENT DOCUMENTS 3-54795  3/1991  Japan .

Primary Examiner—David Nelms
Assistant Examiner—Andrew Q. Tran
Attorney, Agent, or Firm—Foley & Lardner

[57] ABSTRACT

A semiconductor device reduces power supply noise during read operations of a memory device. The semiconductor device includes a plurality of read circuits, a plurality of control circuits and a plurality of output circuits. The read circuits are coupled to the memory device and responsive to a first enable signal to provide readout data during an active period thereof. The output circuits receive the readout data and output the readout data to an external device in response to a second enable signal. The control circuits are coupled between the read circuits and the output circuits and control the output circuits. The control circuits provide output data which is gradually changed to a preset logical value during the active period and to a value equal to the value of the readout data from the read circuits after termination of the active period.

7 Claims, 20 Drawing Sheets

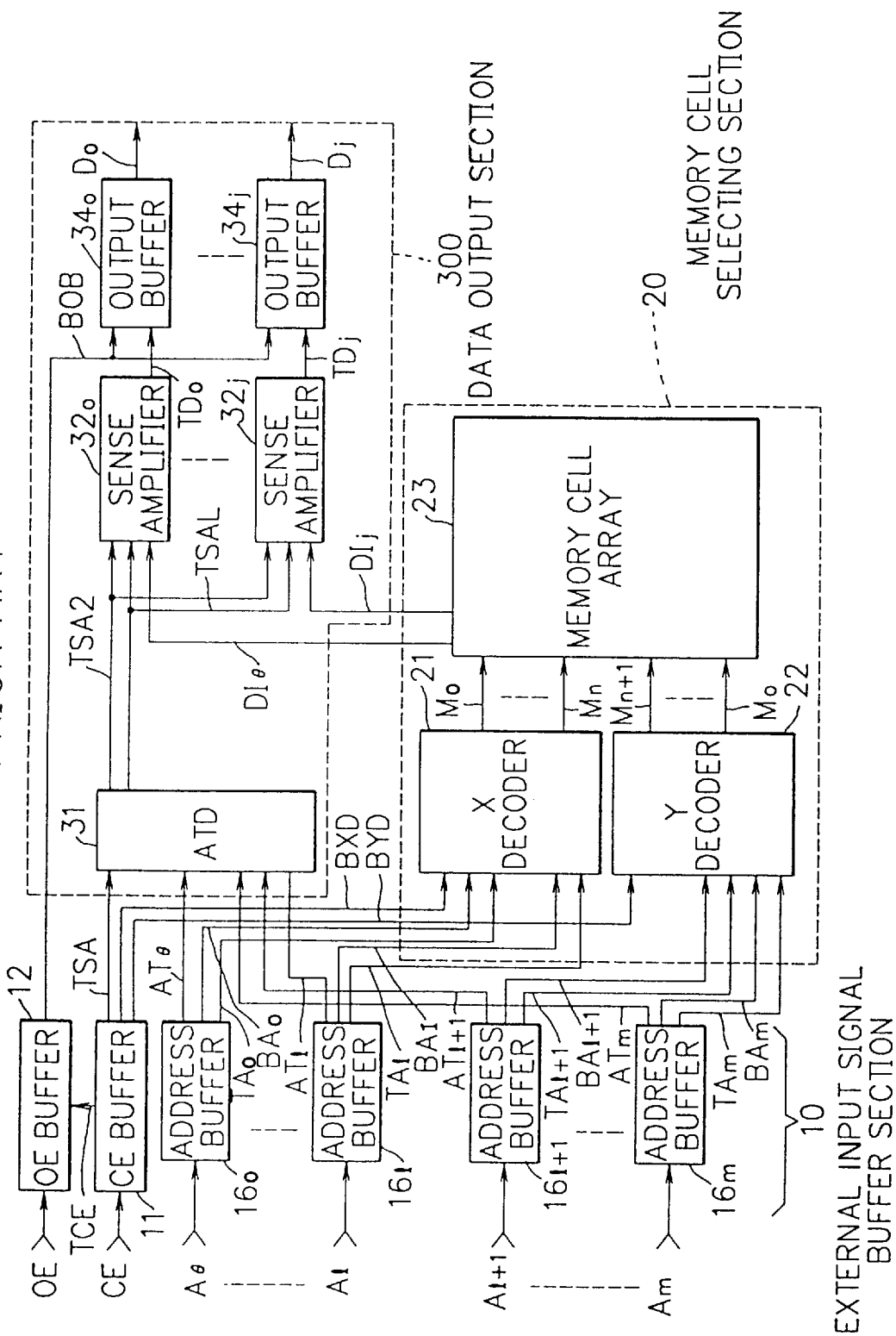

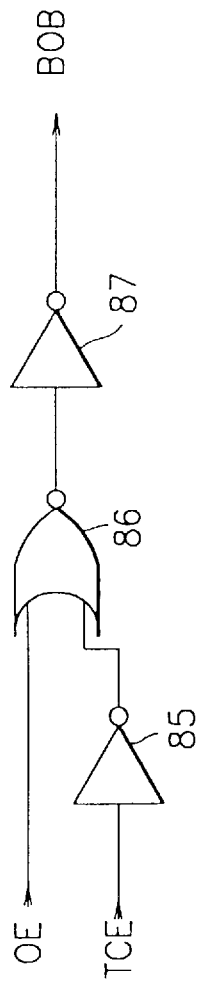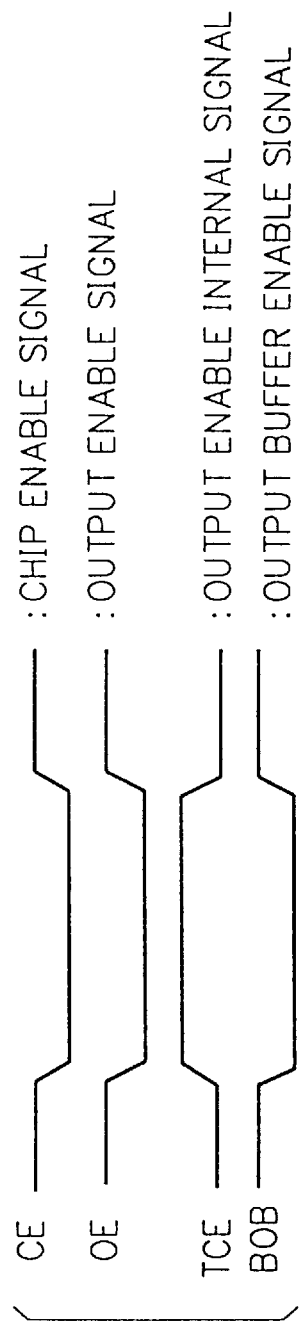
FIG. 3A PRIOR ART
FIG. 3B PRIOR ART
CE : CHIP ENABLE SIGNAL
OE : OUTPUT ENABLE SIGNAL
TCE : OUTPUT ENABLE INTERNAL SIGNAL
BOB : OUTPUT BUFFER ENABLE SIGNAL FIG. 4A PRIOR ART
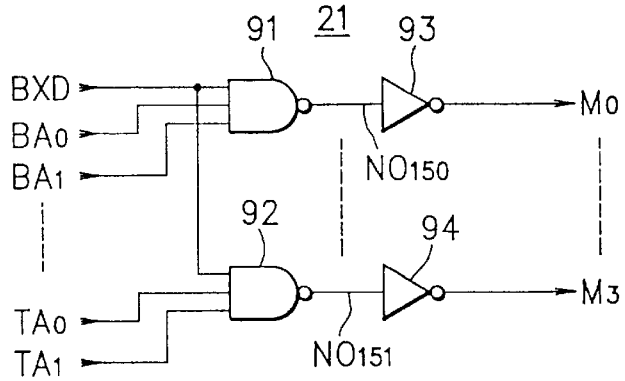
FIG. 4B PRIOR ART
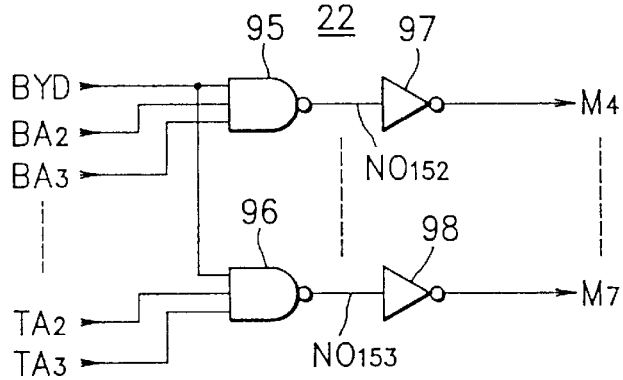
FIG. 4C PRIOR ART
| BXD | BA0 | BA1 | TA0 | TA1 | MEMORY CELL X SELECTION SIGNAL AT "H" LEVEL |
|---|---|---|---|---|---|
| 1 | 1 | 1 | 0 | 0 | M0 |
| ↓ | 1 | 0 | 0 | 1 | M1 |
| ↓ | 0 | 1 | 1 | 0 | M2 |
| ↓ | 0 | 0 | 1 | 1 | M3 |
| 0 | 1or0 | — | — | — | M0 TO M3 AT "L" LEVEL |
FIG. 4D PRIOR ART
| BYD | BA2 | BA3 | TA2 | TA3 | MEMORY CELL Y SELECTION SIGNAL AT "H" LEVEL |
|---|---|---|---|---|---|
| 1 | 1 | 1 | 0 | 0 | M4 |
| ↓ | 1 | 0 | 0 | 1 | M5 |
| ↓ | 0 | 1 | 1 | 0 | M6 |
| ↓ | 0 | 0 | 1 | 1 | M7 |
| 0 | 1or0 | — | — | — | M4 TO M7 AT "L" LEVEL |

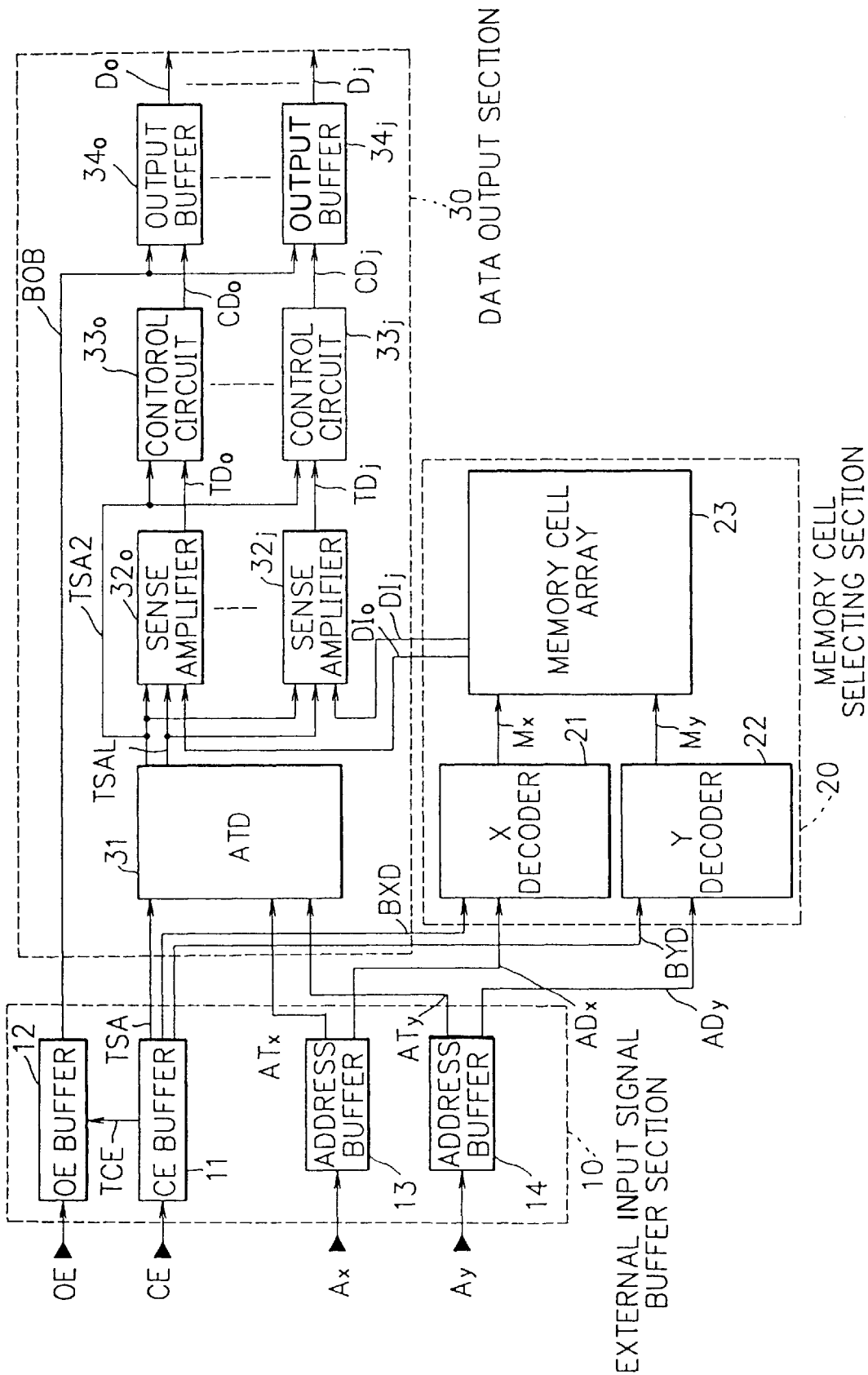
F I G. 10

F I G. 18A
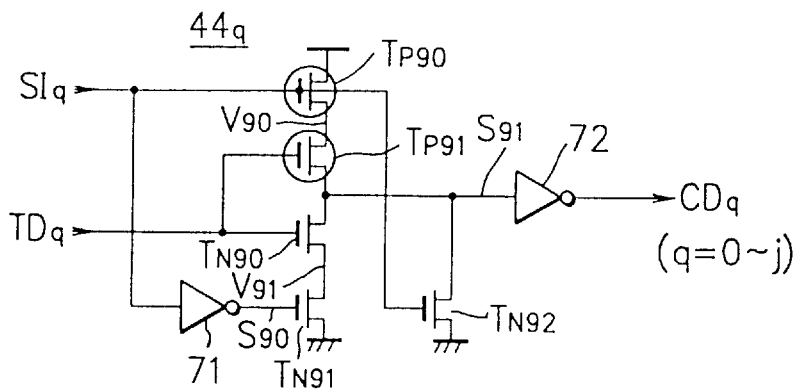
F I G. 18B
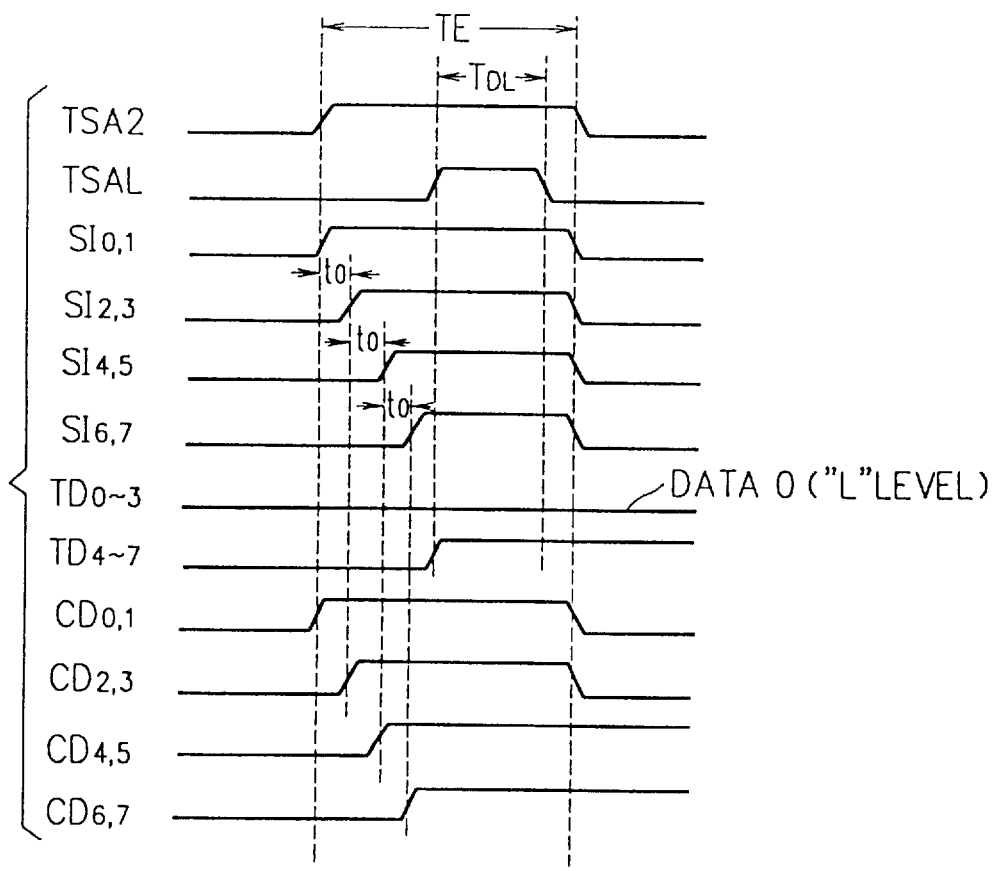

(q=0~j)

(q=0~j)

SEMICONDUCTOR MEMORY DEVICE CAPABLE OF REDUCING POWER SUPPLY NOISE CAUSED BY OUTPUT DATA THEREFROM

BACKGROUND OF THE INVENTION

The present invention relates to a semiconductor device, and in particular, to a semiconductor device which minimizes source power noise appearing when data read from a memory cell array by sense amplifiers is output.

DESCRIPTION OF THE RELATED ART

FIG. 1 shows in a block diagram an example of a conventional semiconductor device. This device includes an external input signal buffer section 10, a memory cell selecting section 20, a data output section 300, (m+1) address input signals, (j+1) data output signals, and a memory cell array 23 in the memory cell selecting section 20. In the array 23, a memory cell is selected by an X address signal and a Y address signal.

The buffer section 10 includes a CE buffer circuit 11 which receives as its input a chip enable signal CE and which outputs a read enable signal TSA, an X decoder enable signal BXD, a Y decoder enable signal BYD, and an output enable internal signal TCE; an OE buffer circuit 12 which receives as inputs thereto an output enable signal OE and the output enable internal signal TCE and which outputs an output buffer enable signal BOB; and (m+1) address buffer circuits $16_o$ to $16_m$ which respectively receive as inputs thereto X address input signals $A_o$ to $A_L$ and Y address input signals $A_{L+1}$ to $A_m$ and which respectively output X address selection signals $TA_o$, $BA_o$ to $TA_L$, $BA_L$, Y address selection signals $TA_{L+1}$, $BA_{L+1}$ to $TA_m$, $BA_m$, X address transition signals $AT_o$ to $AT_L$, and Y address transition signals $AT_{k+1}$ to $AT_m$. In this case, signals $TA_o$ to $TA_m$ are in phase with signals $A_o$ to $A_m$, whereas signals $BA_o$ to $BA_m$ have a phase opposite to that of signals $A_o$ to $A_m$.

The memory cell selecting section 20 includes an X decoder 21 which receives as inputs thereto the X decoder enable signal BXD and the X address selection signals $TA_o$, $BA_o$ to $TA_L$, $BA_L$ and which produces memory cell X selection signals $M_o$ to $M_n$; a Y decoder 22 which receives as inputs thereto the Y decoder enable signal BYD and the Y address selection signals $TA_{L+1}$, $BA_{L+1}$ to $TA_m$, $BA_m$ and which creates memory cell Y selection signals $M_{n+1}$ to $M_o$; and a memory cell array 23 which receives as inputs thereto the memory cell X selection signals $M_o$ to $M_n$ and the memory cell Y selection signals $M_{n+1}$ to $M_o$ and which outputs data read signals $DI_o$ to $DI_j$.

The data output section 300 includes an address transition detection circuit (to be abbreviated as ATD herebelow) 31 which receives as inputs thereto the read enable signal TSA, the X address transition signals $AT_o$ to $AT_L$, and the Y address transition signals $AT_L$ to $AT_m$ and which produces a sense amplifier enable signal TSA2 and a data latch control signal TSAL; (j+1) sense amplifiers $32_o$ to $32_j$ which receive as inputs thereto the sense amplifier enable signal TSA2, the data latch control signal TSAL, and the data read signals $DI_o$ to $DI_j$ and which create sense amplifier output signals $TD_o$ to $TD_j$; and (j+1) output buffer circuits $34_o$ to $34_j$ which receive as inputs thereto the sense amplifier output signals $TD_o$ to $TD_j$ and the output buffer enable signal BOB and which produce output signals $D_o$ to $D_j$.

Subsequently, a description will be given of the operation of each constituent component in the read operation of the conventional device. The read operation is enabled or disabled under control of the chip enable signal CE. In this specification, it is assumed that CE=0 ("L" level) indicates an active state in which the read operation is enabled and CE=1 ("H" level) denotes a non-active state in which the read operation is disabled (standby state).

First, the external input buffer section 10 will be described with reference to FIGS. 2A to 3B. FIG. 2A is a circuit diagram showing an example of the CE buffer circuit 11, FIG. 2B is a diagram showing an example of a circuit of an arbitrary one of the address buffer circuits $16_o$ to $16_m$, and FIG. 2C shows waveforms of the signals of FIGS. 2A and 2B. Additionally, FIG. 3A is a circuit diagram showing an example of the OE buffer circuit 12, whereas FIG. 3B shows waveforms of signals of FIG. 3A.

As shown in FIG. 2A, the CE buffer circuit 11 includes inverters $I_{130}$ and $I_{131}$ in a two-stage cascade connection and inverters $I_{132}$ to $I_{135}$ for receiving output signals therefrom, the signals being produced by branching an output signal from the inverter $I_{131}$. To initiate a read operation, when the signal CE is altered from "1" to "0", the read enable signal TSA, X decoder enable signal BXD, Y decoder enable signal BYD, and output enable internal signal TCE produced respectively from the inverters $I_{132}$ to $I_{136}$ are varied from "0" to "1" as shown in FIG. 2C. In the graph of FIG. 2C, the read enable period is represented as period $T_1$.

The signal TSA controls enablement and disablement of the sense amplifiers $32_o$ to $32_j$ and is supplied to ATD 31. The X decoder enable signal BXD and the Y decoder enable signal BYD are used to respectively activate or to deactivate the X decoder 21 and the Y decoder 22 and are respectively delivered to the X decoder 21 and the Y decoder 22. The output enable internal signal TCE supervises enablement and disablement of the output buffer circuits $34_o$ to $34_j$ in cooperation with the output enable signal OE and is supplied to the OE buffer circuit 12.

On the other hand, the OE buffer circuit 12 includes a 2-input NOR circuit 86, an inverter 85 connected to an input terminal of the NOR circuit 86, and an inverter 87 connected to an output terminal of the NOR circuit 86 as shown in FIG. 3A. The output enable internal signal TCE is supplied to the inverter 85, whereas an output signal from the inverter 85 and the output enable signal OE are fed to the NOR circuit 86.

In the configuration shown, when it is desired to activate the output buffer circuits $34_o$ to $34_j$ so as to output data read from specified memory cells to an external device, the chip enable signal CE and output enable signal OE are required to be set to "0" ("L" level). As can be seen from FIGS. 2C and 3B, when the signal OE is changed from "1" (inactive or nonactive) to "0" (active), the signal TCE is altered from "0" to "1". Consequently, the output signal from the NOR circuit 86 of FIG. 3A is set to "1" and hence the signal BOB from the inverter 87 is varied from "1" to "0" as shown in FIG. 3B. The signal BOB is utilized to directly control enablement and disablement of the output buffer circuits $34_o$ to $34_j$ and is inputted to these circuits $34_o$ to $34_j$.

As indicated in FIG. 2B, the address buffer circuits $16_o$ to $16_m$ each include inverters $I_{136}$ to $I_{142}$. When an arbitrary address input signal $A_k$ (k=0 to m) is altered from the low state (0="L" level) to the high state (1="H" level) as shown in FIG. 2C, the address transition signal $AT_k$ and the address selection signal $TA_k$ respectively outputted from the inverters $I_{137}$ and $I_{139}$ are changed from "0" to "1" (FIG. 2C), and the address selection signal $BA_k$ from the inverter $I_{142}$ of FIG. 2B is altered from "1" to "0" as shown in FIG. 2C.

The address transition signal $AT_k$ is a signal to notify an event that the address input signal $A_k$ has been selected. The signal $AT_k$ is supplied to ATD 31. The address selection signals $TA_k$ and $BA_k$ are used to select an address externally specified and are fed to the X decoder 21 and the Y decoder 22.

In this specification, it is assumed that the points of input timing for the chip enable signal CE and the address input signal $A_k$ can be exchanged for the normal operation. Signals CE and $A_k$ are changed at the same time in this specification. Additionally, the inverters $I_{130}$ to $I_{135}$ and $I_{136}$ to $I_{142}$ included respectively in the CE buffer circuit 11 and address buffer circuits $16_o$ to $16_m$ are so designed to fully drive the wiring capacitance of the output signals and the parasitic capacitance of transistors in the subsequent stage.

Next, the memory cell selecting section 20 will be described. FIG. 4A is a circuit diagram showing an example of the X decoder 21, FIG. 4B is a diagram showing a circuit example of the Y decoder 22, and FIGS. 4C and 4D are tables showing a correspondence between the input signals respectively fed to the X and Y decoders 21 and 22 and the memory cell selection signals thus selected. The memory cell section procedure varies depending on the structure of the memory cell array 23. In FIGS. 4A to 4D, there is shown a selection method of selecting memory cells using four X address selection signals $TA_o$, $BA_o$, $TA_1$, and $BA_1$ created from two X address input signals $A_o$ and $A_1$ and four Y address selection signals $TA_2$, $BA_2$, $TA_3$, and $BA_3$ generated from two Y address input signals $A_2$ and $A_3$.

As can be seen from FIG. 4A, the X decoder 21 includes NAND circuits 91 and 92 and inverters 93 and 94. Although not shown in FIG. 4A, there are also provided a first 3-input NAND circuit receiving as inputs thereto the signals $BA_0$, $TA_1$, and BXD; a second 3-input NAND circuit receiving as inputs thereto the signals $BA_1$, $TA_0$, and BXD; and inverters arranged on the output sides of these NAND circuits. Produced from these circuits are X selection signals $M_1$ and $M_2$.

When the X decoder enable signal BXD is "0", the output signals from all NAND circuits such as circuits 91 and 92 are set to "1" ("H" level) and the memory cell X selection signals $M_0$ to $M_3$ produced from the inverters including the inverters 93 and 94 are set to "0" ("L" level) regardless of the address selection signals $BA_0$, $BA_1$, $TA_0$, and $TA_1$. Namely, neither one of the memory cell X selection signals is selected in this state.

When the signal BXD is "1", one of the memory cell X selection signals $M_0$ to $M_3$ is "1" ("H" level) and the three remaining signals are "0" ("L" level) according to a combination of the address selection signals $BA_0$, $BA_1$, $TA_0$, and $TA_1$ as shown in FIG. 4C. In this situation, the signal set to "1" is the selected signal. For example, when the signals is $BA_0$=1, $BA_1$=1, $TA_0$=0, and $TA_1$=0, only the output signal from the NAND circuit 91 is "0" ("L" level) such that only the signal $M_0$ from the inverter 93 is "1" ("H" level) and the other signals $M_1$ to $M_3$ are "0" ("L" level). On this occasion, only the selection signal $M_0$ is selected, i.e., the memory cell X selection signal can be selected only when the X decoder enable signal BXD is "1".

This is also the case with the Y decoder 22. As shown in FIG. 4B, the circuit configuration includes four 3-input NAND circuits such as NAND circuits 95 and 96 and four inverters including inverters 97 and 98. Only when the Y decoder enable signal BYD is "1", the memory cell Y selection signal can be selected. FIG. 4D is a table showing the correspondence between the Y address selection signals $BA_2$, $BA_3$, $TA_2$, and $TA_3$ and the selected memory cell Y selection signal.

The memory cell selection signals selected by the X and Y decoders 21 and 22 are inputted to the memory cell array 23 of FIG. 1 to thereby select the specified memory cells. In each read operation, data items of the memory cells are read therefrom in association with (j+1) data output signals ($D_o$ to $D_j$ of FIG. 1) and are inputted as data readout signals $DI_o$ to $DI_j$ to the sense amplifiers $32_o$ to $32_j$. The concrete method of generating the data readout signals $DI_o$ to $DI_j$ varies depending on the memory cell structure and the configuration of the memory array 23 and hence will not be described in detail in this specification.

Subsequently, the data output section 300 will be described. FIG. 5A is a block diagram showing an example of ATD 31, and FIG. 5B shows the waveforms of the primary signals of FIG. 5A. As can be seen from FIG. 5A, ATD 31 includes a delay circuit 101 and signal composing circuits 102 and 103. The circuits 102 and 103 of FIG. 5A are configured as shown in FIG. 7. However, for simplification of explanation, it is assumed that there are inputted four X address transition signals $AT_{x0}$ to $AT_{x3}$ and four address transition signals $AT_{y0}$ to $AT_{y3}$.

In the signal composing circuit 102, $VI_{x0}$ to $VI_{x3}$ of FIG. 7 respectively correspond to the X address transition signals $AT_{x0}$ to $AT_{x3}$. Similarly, $VI_{y0}$ to $VI_{y3}$ are associated with the Y address transition signals $AT_{y0}$ to $AT_{y3}$ and an output signal $VO_0$ corresponds to the sense amplifier enable signal TSA2.

In the signal composing circuit 103, $VI_{x0}$ to $VI_{x3}$ and $VI_{y0}$ to $VI_{y3}$ of FIG. 7 are respectively associated with the output signals $DAT_{x0}$ to $DAT_{x3}$ and $DAT_{y0}$ to $DAT_{y3}$ of the delay circuit 101 of FIG. 5 and an output signal $v_{OO}$ corresponds to the data latch control signal TSAL.

Assume in this situation that the input signals to the delay circuit 101 includes the X address transition signals $AT_{x0}$ to $AT_{x3}$ and Y address transition signals $AT_{y0}$ to $AT_{y3}$. Moreover, the signals $DAT_{x0}$ to $DAT_{x3}$ are in phase with the signals $AT_{x0}$ to $AT_{x3}$ and are delayed for a period of $T_D$ relative thereto, and the signals $DAT_{y0}$ to $DAT_{y3}$ are in phase with the signals $AT_{y0}$ to $AT_{y3}$ and are delayed for a period of $T_D$ relative thereto.

The pulse width of the data latch control signal TSAL is designed to be less than the pulse width of the sense amplifier enable signal TSA2. FIG. 5C shows waveforms of the signals TSA2 and TSAL when the read enable signals TSA and X address transition signal $AT_{x0}$ initially acquired are changed from "0" to "1" at the same time and then the signals $AT_{x1}$ and $AT_{y0}$ are altered from "0" to "1" with a shift of time of $T_{DIO}$ in a sequential fashion.

The sense amplifier enable signal TSA2 is a pulse signal of positive polarity changing 0→1→0 with a pulse width $T_{wo1}$ beginning at a first transition point of the signals TSA and $AT_{xo}$ from "0" to "1". The signal TSAL is a pulse signal of positive polarity changing 0→1→0 with a pulse width $T_{wo2}$ smaller than $T_{wo1}$, the signal rising with delay of time $T_D$ relative to the signal TSA2. As above, ATD 31 detects the change of the signals TSA and $AT_S$ and as a result generates the signals TSA2 and TSAL.

As scan be seen from FIG. 7, each of the signal composing circuits 102 and 103 receives as inputs thereto the read enable signal TSA and the signals $VI_{x0}$ to $VI_{x3}$ and $VI_{y0}$ to $VI_{y3}$ and includes 1-pulse generator circuits $P_0$ to $P_8$, inverters $I_{180}$ to $I_{188}$, AND circuits 121 to 126 and 128, and NAND circuit 127 to produce a signal $VO_o$.

Next, the operation of the signal composing circuits 102 and 103 will be described. As shown in FIG. 5B, assume that the read enable signal TSA and input signal $VI_{x0}$ are simultaneously changed from "0" ("L" level) to "1" ("H" level) and then the input signals $VI_{x1}$ and $VI_{yo}$ are altered with an interval time of $T_{DI}$ from "0" ("L" level) to "1" (="H" level; however, input signals $VI_{x2}$, $VI_{x3}$, and $VI_{y1}$ to $VI_{y3}$ are maintained at "0" ("L" level)). In this situation, when the signal $VI_{xo}$ is input to the composing circuit 102 or 103, one positive-polarity pulse having a preset pulse width of $T_w$ is generated from the 1-pulse generator $P_o$. The polarity of the pulse signal is then inverted through the inverter $I_{180}$ to generate a pulse signal $PG_o$, which is then supplied to the AND circuit 121.

The operation above also applies to the signals TSA, $VI_{x1}$, and $VI_{y0}$. Beginning at a point where the signal is changed from "0" to "1", signals $PG_8$, $PG_1$, and $PG_4$, each having a pulse width of $T_w$, are respectively output from the inverters $I_{188}$, $I_{181}$, and $I_{184}$ of FIG. 7 as shown in FIG. 5B. Signals $PG_2$, $PG_3$, and $PG_5$ to $PG_7$ corresponding to the signals $VI_{x2}$, $VI_{x3}$, and $VI_{y1}$ to $VI_{y3}$ are maintained "1" ("H" level).

The signal $OS_0$ is output from the AND circuit 121 which receives as inputs thereto the signals $PG_8$, $PG_0$, and $PG_1$. The signal $OS_0$ as can be seen from FIG. 5B, is a negative-polarity pulse signal which begins at change start point ① of the signals TSA and $VI_{x0}$ previously changed and which ends at change point ② where the pulse signal $PG_1$ (from the signal $VI_{x1}$ changed after period $T_{D1}$) is changed from "0" to "1". Furthermore, the signal $OS_1$ created from the AND circuit 122 is "1". The signal $OS_2$ produced from the AND circuit 123 is a negative-polarity pulse signal having pulse width $T_w$, the signals $OS_2$ being in phase with the signal $PG_4$. The signal $OS_3$ output from the AND circuit 124 is "1".

In addition, the output signal from the AND circuit 125 is produced as a logical product between the output signals respectively from the AND circuits 121 and 122 and hence is a negative-polarity pulse signal, $OS_4$ shown in FIG. 5B, and is in phase with the signal $OS_o$. Moreover, the output signal from the AND circuit 126 is produced by ANDing the output signals from the AND circuits 123 and 124 and hence is a negative-polarity pulse signal, $OS_5$ shown in FIG. 5B, and is in phase with the signal $OS_0$.

Consequently, as shown in FIG. 5B, the output signal $OS_6$ from the NAND circuit 127 receiving both output signals from the AND circuits 125 and 126 is a positive-polarity pulse signal which begins at change start point ① of the signals TSA and $VI_{x0}$ first changed from "0" to "1" among the input signals $VI_{x0}$, $VI_{x1}$, and $VI_{y0}$ and which ends at change point ③ where the pulse signal $PG_4$ generated from the signal $VI_{y0}$ last changed is changed from "0" to "1".

The pulse signal $OS_6$ is supplied to the AND circuit 128 together with the read enable signal TSA. In response thereto, since the signal TSA is "1", the signal $VO_0$ output from the AND circuit 128 is equal to the signal $OS_6$ as shown in FIG. 5B.

Furthermore, when the signal TSA is "0" ("L" level), the output signal $V0_0$ from the AND circuit 128 is "0" regardless of the data values of input signals $VI_{x0}$ to $VI_{x3}$ and $VI_{y0}$ to $VI_{y3}$.

In this connection, FIG. 6A shows the circuit of each of the 1-pulse $P_0$ to $P_8$, and FIG. 6B shows waveforms of signals in the circuit. Each pulse generator includes inverters 111 to 116, a NOR circuit 117, resistor elements $R_{170}$ and $R_{171}$, and capacitors $C_{170}$ and $C_{171}$. When the input signal $V_{i1}$ is changed from "0" to "1", the output signals S1 to S4 respectively from the inverters 111, 113, 115, and 116 are respectively varied as shown in FIG. 6B. The signals S4 and S1 are supplied to the NOR circuit 117, which then creates a positive-polarity pulse signal $V_{o1}$ having pulse width 2t as shown in FIG. 6B. The value of pulse width 2t is determined according to the values of the resistors $R_{170}$ and $R_{171}$ and capacitors $C_{170}$ and $C_{171}$.

FIG. 6C shows an example of the delay circuit 101 shown in FIG. 5A, and FIG. 6D shows waveforms of signals in the delay circuit 101. As can be seen from FIG. 6C, the circuit 101 operates such that the polarity of the signal $V_{i2}$ is reversed through an inverter 118 to be integrated by an integrating circuit including a resistor $R_{172}$ and a capacitor $C_{172}$ such that the integrated signal is fed to an inverter 119, which in turn produces an output signal $V_{02}$ as follows. When the signal value is equal to or more than a predetermined threshold value, the polarity is inverted to obtain the signal $V_{02}$ representing "0"; otherwise, the polarity is inverted to attain the signal $V_{02}$ indicating "1". Through the operation, there is produced the output signal $V_{02}$ delayed $t_D$ relative to the input signal $V_{i2}$ as shown in FIG. 6D.

Conducting the operations above, ATD 31 detects the change of the read enable signal TSA and address transition signal $AT_s$, outputs as the sense amplifier enable signal TSA2 the signal $VO_o$ from the signal composing circuit 102, and outputs as the data latch control signal TSAL the signal $VO_0$ from the signal composing circuit 103. The signals TSA2 and TSAL are fed to the sense amplifiers $32_o$ to $32_j$, which will be described below.

The amplifiers $32_o$ to $32_j$ are equal configuration to each other in circuit configuration. FIG. 8A shows the circuit layout as indicated with 32 ($32_o$ to $32_j$). FIG. 8B is a circuit diagram showing an example of the output buffer ($34_o$ to $34_j$). As can be seen from FIG. 8A, the amplifier 32 includes a sense amplifier section 131 including p-channel metal oxide semiconductor (MOS) transistors (to be abbreviated as PchTr. herebelow) $T_{p190}$ and $T_{p191}$, n-channel MOS transistors (to be abbreviated as NchTr. herebelow) $T_{N190}$ to $T_{N193}$, inverters $I_{190}$ and $I_{191}$, and a reference signal generator 135 and a data latch section 132 including p-channel MOS transistors $T_{p192}$ to $T_{p194}$, n-channel MOS transistors $T_{N194}$ to $T_{p196}$, and inverters $I_{192}$, $I_{193}$, and $I_{195}$.

When the enable signal TSA2 is "0" ("L" level), the transistor $T_{N193}$ is nonconductive and hence the sense amplifier section 131 is set to a nonactive state. The inverter $I_{191}$ accordingly produces an output signal $S_{190}$ at an intermediate potential. In this situation, the inverter $I_{190}$ outputs a signal of "1", which is supplied to a gate of the transistor $T_{N192}$. As a result, the transistor $T_{N192}$ becomes conductive and hence nodes $V_0$ and $V_1$ are set to the same potential. In contrast therewith, when the signal TSA2 is "1" ("H" level), i.e., in a state opposite to the state above, the transistors $T_{N193}$ and $T_{N192}$ are respectively conductive and nonconductive to activate the sense amplifier section 131. The transistors $T_{P190}$ and $T_{P191}$ and the transistors $T_{N190}$ and $T_{N191}$ form a differential stage.

Since the method of generating the reference signal $V_{ref}$ varies depending on the configuration of the memory cell array and the like, the detailed configuration of the reference signal generator 135 will not be described in this specification. The reference signal $V_{ref}$ created from the generator 135 has a signal level at an intermediate point between the levels respectively corresponding to data "0" and data "1" of the data read signal $DI_q$ as shown in FIG. 9A.

For data "0", the level of signal $DI_q$ is assumed to be higher than that of reference level $V_{ref}$ (FIG. 9A). Since the signal $DI_q$ is applied to a gate of $T_{N190}$ of FIG. 8A and the signal $V_{ref}$ is fed to a gate of $T_{N191}$, the potential (drain potential of $T_{N191}$) of node $V_1$ is higher than that (drain potential of $T_{N190}$) of node $V_0$ for data "0" in the active state. Moreover, the data "1", the level of signal $DI_q$ is assumed to be lower than that of reference level $V_{ref}$ such that the potential of node $V_1$ is lower than that of node $V_0$ in this situation.

Additionally, when the threshold value of inverter $I_{191}$ is set to an intermediate value between the level of node $V_1$ for data "0" and that of node $V_1$ for data "1", the output signal from the inverter $I_{191}$, i.e., the output signal $S_{190}$ from the amplifier section 131, is at "L" level as denoted by a solid line for data "0" and at "H" level as indicated by a dot-and-dash line for data "1" during a period of $T_{w01}$ in which the enable signal TSA2 is at "H" level as shown in FIG. 9A. In the active state, the operation is started in an equipotential state in which nodes $V_o$ and $V_1$ are at the same potential and hence there can be implemented a high-speed sense amplifier according to the configuration shown.

Subsequently, the data latch section 132 will be described. When the data latch control signal TSAL is "0" ("L" level), the transistor $T_{P192}$ receiving via its gate a signal obtained by inverting the signal TSAL and the transistor $T_{N195}$ receiving the signal TSAL via its gate are in a nonconductive state. Therefore, $T_{P193}$ and $T_{N194}$ constituting a complementary MOS configuration are off, and the output signal $S_{190}$ delivered from the sense amplifier section 131 to the gate shared between $T_{P193}$ and $T_{N194}$ is not transferred to the subsequent stage. Consequently, the signal $S_{191}$ from the drain common to $T_{P193}$ and $T_{N194}$ is set to an intermediate potential.

In this state, $T_{P194}$ and $T_{N196}$ sharing a drain and a source respectively therebetween are conductive due to the data latch control signal TSAL at "0" level and then the output signal from the inverter $I_{193}$ is fed to the inverter $I_{192}$ and the output signal from the inverter $I_{192}$ is delivered to the inverter $I_{193}$. Namely, as can be seen from FIG. 9A, the data latched in the latch section 132 before the section 132 is enable is output as the output signal $TD_q$ (q=0 to j corresponding to output buffers $34_o$ to $34_j$) from the inverter $I_{192}$.

On the other hand, when the control signal TSAL is "1" ("H" level), i.e., in a state reverse to the state above, the transistors $T_{P192}$ and $T_{N195}$ become conductive, and $T_{P194}$ and $T_{N196}$ become nonconductive. In this case, consequently, the output signal $S_{190}$ fed from the amplifier section 131 to the common gate of $T_{P193}$ and $T_{N194}$ is inverted via $T_{P193}$ and $T_{N194}$ to be output as a signal $S_{191}$ from the drain shared therebetween. The phase of signal $S_{191}$ is then inverted via the inverter $I_{192}$ to be output as the sense amplifier output signal $TD_q$. In consequence, during a period $T_{w02}$ in which the signal TSAL is at "H" level, the output signal $TD_q$ is in phase with the signal $S_{190}$ produced from the amplifier section 131 as shown in FIG. 9A.

Next, the output buffers $34_o$ to $34_j$ will be described. The buffers are of the same configuration including, as shown in FIG. 8B, a p-channel transistor $T_{P195}$, an n-channel transistor $T_{N197}$, an inverter 141, an NAND circuit 142, and an NOR circuit 143.

In operation of the output buffers 34 ($34_o$ to $34_j$), when the output buffer enable signal BOB is "1" ("H" level), the inverter 141 produces an output signal $S_{194}$ representing "0" ("L" level) and hence the NAND circuit 142 creates an output signal $S_{192}$ denoting "1" regardless of the sense amplifier output signal $TD_q$. The NOR circuit 143 generates an output signal $S_{193}$ indicating "0" regardless of the signal $TD_q$. Therefore, $TP_{195}$ receiving via its gate the signal $S_{192}$ from the NAND circuit 142 is nonconductive. Similarly, $TN_{197}$ receiving via a gate thereof the signal $S_{193}$ from the NOR circuit 143 is also nonconductive and the data output signal $D_q$ is set to an intermediate potential.

When the enable signal BOB is "0" ("L" level), the phase of signals $S_{192}$ and $S_{193}$ is opposite to that of the signal $TD_q$ as shown in FIG. 9B. That is, when the signal $TD_q$ is at "H" level, the signals $S_{192}$ and $S_{192}$ are at "L" level. As a result, $T_{P195}$ is conductive and $T_{N197}$ is nonconductive and the data output signal $D_q$ is at "H" level. When the signal $TD_q$ is at "L" level, the signals $S_{192}$ and $S_{193}$ are at "H" level. Consequently, $T_{P195}$ is nonconductive and $T_{N197}$ is conductive and hence a discharge current $I_{N197}$ flows through $T_{N197}$ and the signal $D_q$ is set to "L" level. As a result, as can be seen from FIGS. 9A and 9B, the data output signal $D_q$ is in phase with the output signal $TD_q$ from the sense amplifier $32_q$, namely, the readout data is obtained.

The read operation of the conventional semiconductor above will be briefly described as follows. When the chip enable signal CE is altered from "1" to "0" or when either one of the address input signals $A_o$ to $A_m$ are varied from "0" to "1" under a condition of signal CE=0, the read operation is carried out by the sense amplifier section 131 of the sense amplifier 32 for a preset period ($T_{w01}$ of FIG. 5C). During a period from when the amplifier section 131 starts the read operation to when the operation is stabilized, the data latched in the data latch 132, namely, the data previously latched before the amplifier 32 is enable is outputted from the amplifier 32.

When the predetermined period of time ($T_D$ of FIG. 5C) lapses, the data read out by the amplifier 32 is started to be output. The output data from the amplifier 32 is delivered to an external device when the output enable signal OE=0 is supplied to the semiconductor device. After the data output is completed, when the state "CE=1 and OE=1" is restored, the read operation is terminated and then the semiconductor device returns to the standby state.

FIG. 9C shows waveforms of the sense amplifier output signal $TD_q$, the data output signal $D_q$, the GND power source, and the discharge current (total of all output buffers) of $T_{N197}$ when the data output signal $D_q$ (q=0 to j) from the chip section is changed from "1" ("H" level) to "0" ("L" level).

However, in accordance with the conventional semiconductor described above, the data output signals $D_o$ to $D_j$ are simultaneously changed and output at the same time. Consequently, when a plurality of output signals are simultaneously altered from "1" to "0", the discharge current ($I_{N197}$) related to $T_{N197}$ in the output buffer corresponding to each of the pertinent data output signals is transmitted to the GND power source at the same time. As a result, the GND potential is varied as shown in FIG. 9C. Alternatively, when the output signals are changed from "0" to "1", the charge current appearing in each p-channel MOS transistor in the final output stage is sent to the $V_{CC}$ power source at the same time, which as a result varies the $V_{CC}$ potential.

In consequence, the output level of the data latch internal signal $S_{191}$ (FIG. 8A) of the sense amplifier $32_q$ exceeds the inversion threshold value of the inverter $I_{192}$ and hence an erroneous data item ("1"="H" level in this case) is latched, which results in the occurrence of a data read error. Additionally, the fluctuation of variation in the GND or $V_{CC}$ power source exerts an adverse influence in the constituent circuits, which may lead to operation errors. As above, in the conventional semiconductor device, the erroneous operations due to the deviation or change in the GND or $V_{CC}$ potential deteriorates reliability of the read operation.

A device is known to overcome this difficulty, as described in the Japanese Patent Laid-Open Publication Ser.

No. 3-54795, i.e., a semiconductor device including means for preventing the operation error due to noise components in the power source (power source noise). The operation error preventing means of the semiconductor device described in the Japanese Patent Laid-Open Publication Ser. No. 3-54795 includes a plurality of delay circuits connected to sense amplifiers to provide a difference of time between points of enable timing of the respective sense amplifiers according to enable signals produced from a sense amplifier enable circuit (corresponding to ATD 31 of FIG. 1). Thanks to the differential time between the enable timing points of the sense amplifiers (associated with $32_o$ to $32_j$ of FIG. 1), there is provided a difference of time between points of the output timing of the data output signals (corresponding to $D_o$ to $D_j$ of FIG. 1).

In accordance with the semiconductor device, the discharge current supplied to the GND power source is dispersed to thereby lower a peak value of the discharge current so as to suppress the variation in the GND potential. However, in the device described in the publication, since the points of timing to activate the respective sense amplifiers are sequentially delayed, there arises a problem that the points of timing to the output data items (i.e., read speed) are delayed by the difference of time provided to the amplifier enable timing.

SUMMARY OF THE INVENTION

It is therefore an object of the present invention to provide a semiconductor device in which the variation in the GND power source taking place when a plurality of data output signals are simultaneously altered from "1" (="H" level) to "0" (="L" level) or the variation in the $V_{CC}$ power source appearing when a plurality of data output signals are changed from "0" to "1" is suppressed to prevent any operation errors related thereto. The invention thus improves the read operation reliability to thereby remove the above described problem.

Furthermore, another object of the present invention is to provide a semiconductor device in which the variation in the GND or $V_{CC}$ power can be suppressed to prevent operation errors associated therewith.

To achieve the objects above in accordance with the present invention, there is provided a semiconductor device including a plurality of read circuits for achieving a memory read operation during an active period in which a first enable signal inputted thereto is a first logical value, outputting previous readout data until a control signal is inputted thereto during the active period, and outputting readout data thus read from the memory in response to the control signal; a plurality of output circuits for receiving as input signals thereto readout data from associated ones of the plural read circuits and a second enable signal and outputting to an external device the readout data inputted thereto during an active period in which the second enable signal is a predetermined logical value; and a plurality of control circuits provided in association with the plural read circuits. The control circuits receive as input signals thereto readout data from the read circuits and the first enable signal. The control circuits forcibly fix the readout data thus inputted thereto to a predetermined logical value regardless of values of the readout data during a period from a change point of the first enable signal to the first logical value to a point of time when the control signal is inputted to the read circuits. Moreover, the control circuits output, when the first enable signal is changed to the second logical value, the readout data having the logical value to the output circuits.

In accordance with the present invention, thanks to the control circuits, during a period from the change point of the first enable signal to the first logical value to the input point of the control signal to the read circuit, the input readout data is forcibly fixed to a predetermined logical value regardless of the value of the data to supply the logic value to the output circuit such that the input readout data is forcibly fixed to a predetermined logical value regardless of the value of the data with mutually different values of time differences between the data items or between data item groups each including a plurality of data items. Consequently, when a plurality of readout data items are simultaneously changed to the predetermined logical value, the discharge current (or the charge current) from the final stage of the output circuit can be dispersed. Moreover, since the readout data is outputted to an external device after the read circuit enable period is finished, the readout data can be outputted in a state in which the GND or $V_{CC}$ power source is stable.

In addition, the semiconductor device in accordance with the present invention further includes a plurality of control circuits provided in association with the plural read circuits for generating output circuit control signals in accordance with the readout data from the read circuits and the first enable signal and outputting the control signals to the output circuits. The control circuits control the output circuits by the control signals such that the output data therefrom is gradually changed to a predetermined logical value during the enable period of the read circuits and the output data has a logical value equal to the value of the readout data from the read circuits after the active period of the read circuits is completed.

In accordance with the present invention, during the read circuit enable period, the output data is gradually changed to the predetermined logical value thus preset. Therefore, when a plurality of readout data items are simultaneously changed to the predetermined logical value, the sudden occurrence of the discharge current (or the charge current) from the final stage of the output circuit can be prevented. Furthermore, since the readout data is fed to an external device after the read circuit enable period is completed, the readout data can be outputted with the GND or $V_{CC}$ power source in a stable state.

BRIEF DESCRIPTION OF THE DRAWINGS

The objects and features of the present invention will become more apparent from the consideration of the following detailed description taken in conjunction with the accompanying drawings in which:

FIG. 1 is a block diagram showing an example of a conventional semiconductor device;

FIGS. 3A and 3B are a circuit diagram of a conventional OE buffer and a graph showing waveforms in the circuit;

FIGS. 4A and 4B are a circuit diagrams showing examples of an X decoder unit and a Y decoder unit of the prior art;

FIGS. 4C and 4D are tables respectively showing a correspondence between memory cell X selection signals and input signals and a correspondence between memory cell Y selection signals and input signals;

FIG. 10 is a block diagram showing the configuration of a first embodiment in accordance with the present invention;

FIG. 18A is a circuit diagram showing a data output switch circuit in a third embodiment in accordance with the present invention;

FIG. 18B is a graph showing waveforms for explaining operation of the third embodiment in accordance with the present invention;

DESCRIPTION OF THE PREFERRED EMBODIMENTS

Figure 2A:
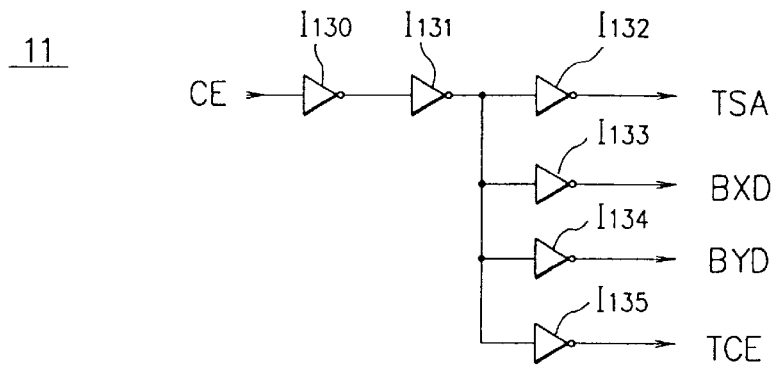
FIGS. 2A and 2B are circuit diagrams showing examples of a CE buffer and an address buffer of the conventional semiconductor device.
Figure 2B:
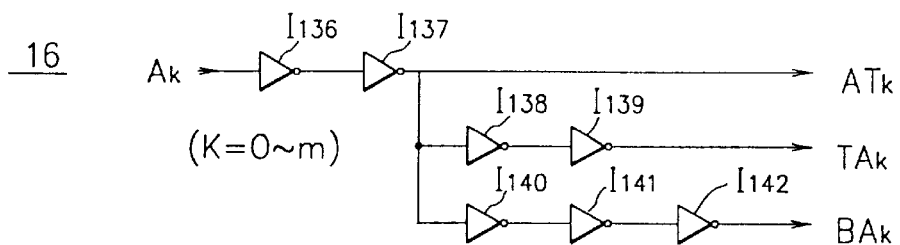
Figure 2C:
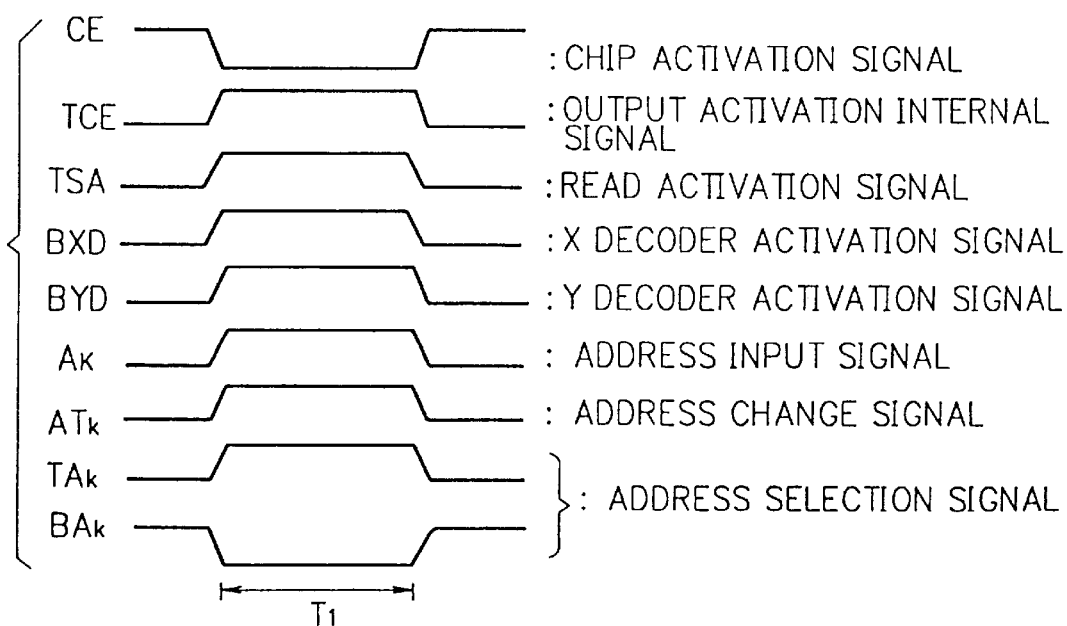
FIG. 2C is a graph showing waveforms for explaining operation of the circuits of FIGS. 2A and 2B.
Figure 5A:
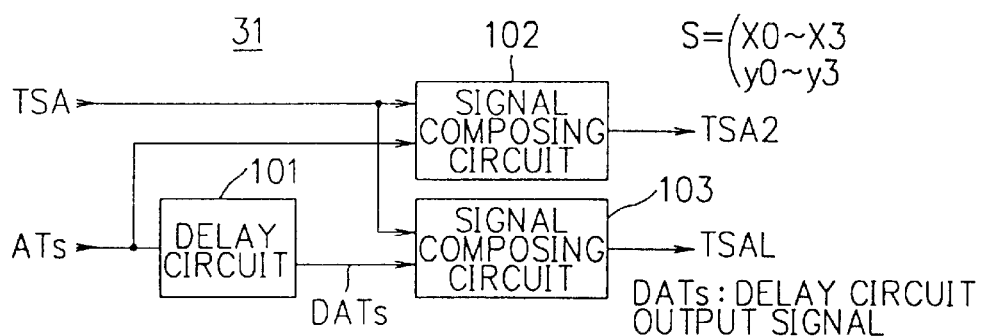
FIG. 5A is a block diagram showing an example of an address transition detection (ATD) circuit of the conventional technology.
Figure 5B:
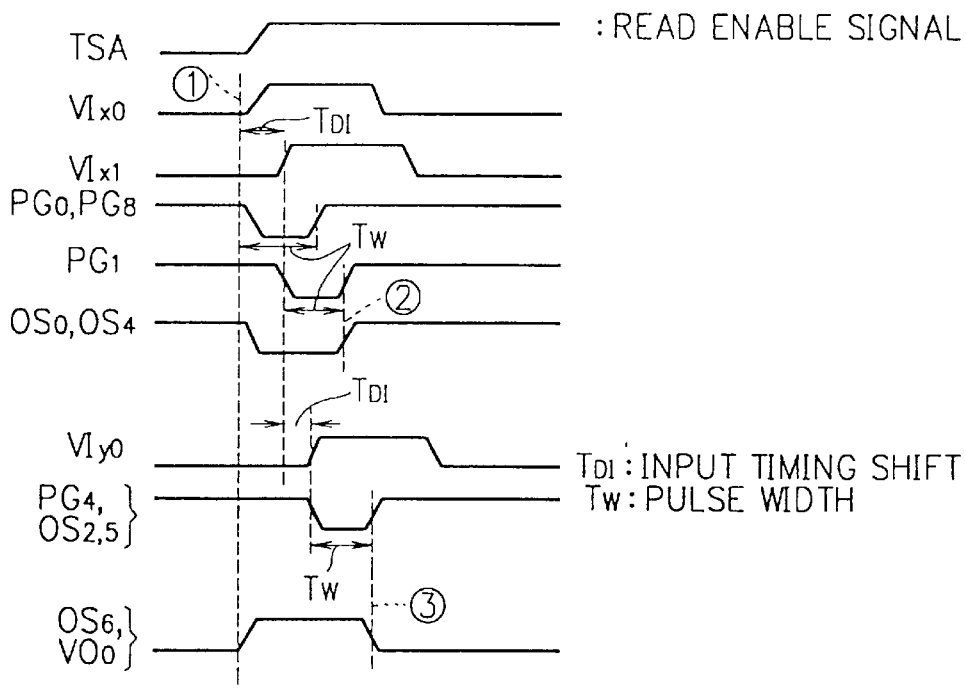
FIGS. 5B and 5C are graphs for explaining operations of the ATD and signal composing circuits.
Figure 5C:
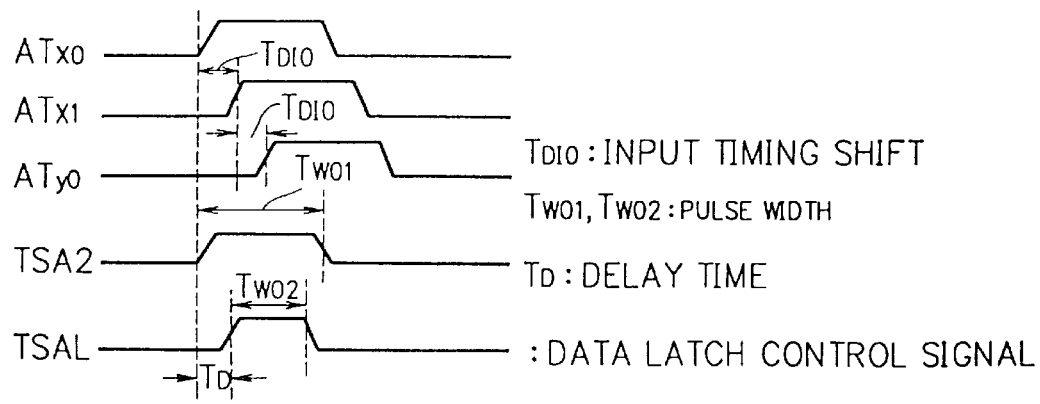
Figure 6A:
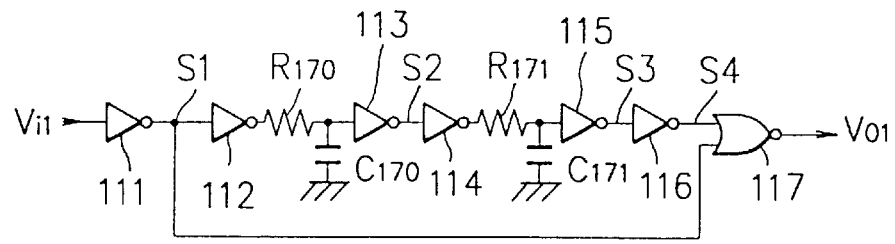
FIG. 6A is a block diagram showing an example of a conventional 1-pulse generating circuit and FIG. 6B is a graph for explaining operation of the circuit.
Figure 6B:
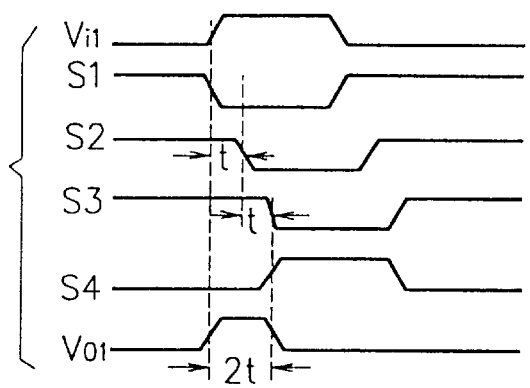
Figure 6C:
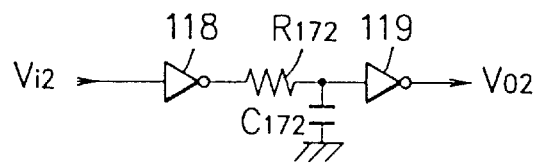
FIG. 6C is a block diagram showing an example of a conventional delay circuit and FIG. 6D is a graph for explaining operation of the circuit.
Figure 6D:
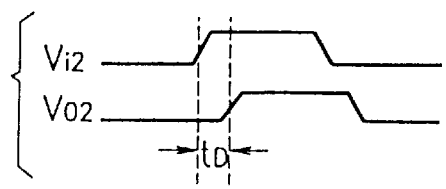

Referring now to the drawings, description will be given of embodiments of the semiconductor device in accordance with the present invention.

FIG. 10 shows in a block diagram the configuration of an embodiment of the semiconductor device in accordance with the present invention. The system of the embodiment shown in FIG. 10 preferably includes an external input signal buffer section 10, a memory cell selecting section 20, and a data output section 30 to produce (j+1) data output signals. The section 20 includes a memory cell array of which memory cells are selected by an X address signal and a Y address signal.

The buffer section 10 and the selector section 20 are respectively of the same configurations as those of the conventional semiconductor device shown in FIG. 1. Therefore, the circuit configuration and operation of the constituent components are also substantially the same as those of the prior art. In this regard, the X address input signals $A_o$ to $A_L$ of FIG. 1 are designated as $A_x$ in FIG. 10. Similarly, the Y address input signals $A_{L1}$ to $A_m$ of FIG. 1 are indicated as $A_y$ in FIG. 10; the X address selection signals $TA_o$, $BA_o$ to $TA_L$, $BA_L$ of FIG. 1 are denoted as $AD_x$ in FIG. 10, the Y address selection signals $TA_{L+1}$, $BA_{L+1}$ to $TA_m$, $BA_m$ of FIG. 1 are denoted as $AD_y$ in FIG. 10; the X address transition signals $AT_o$ to $AT_L$ of FIG. 1 are represented as $AT_x$ in FIG. 10, the Y address transition signals $AT_{L+1}$ to $AT_m$ of FIG. 1 are designated as $AT_y$ in FIG. 10; the memory cell X selection signals $M_o$ to $M_n$ of FIG. 1 are denoted as $M_x$ in FIG. 10, and the memory cell Y selection signals $M_{n+1}$ to $M_o$ of FIG. 1 are indicated as $M_y$ in FIG. 10.

As can be seen from FIG. 10, in accordance with an aspect of the present invention, control circuits $33_o$ to $33_j$ are respectively arranged for output buffers $34_o$ to $34_j$ in the data output section 30 in which output control signals $CD_o$ to $CD_j$ respectively from the control circuits $33_o$ to $33_j$ are fed to the output buffers $34_o$ to $34_j$, respectively. That is, the data output section 30 includes an address transition detection (ATD) circuit 31, sense amplifiers $32_o$ to $32_j$, control circuits $33_o$ to $33_j$, and output buffers $34_o$ to $34_j$.

First Embodiment

The control circuits $33_o$ to $33_j$ receive as inputs thereto a sense amplifier enable signal TSA2 produced from ATD 31 and sense amplifier output signals $TD_o$ to $TD_j$ to thereby respectively create control signals $CD_o$ to $DC_j$. Circuit configurations and operations of ATD 31 and the sense amplifiers $32_o$ to $32_j$ are almost the same as those of the conventional semiconductor device.

Figure 11A:
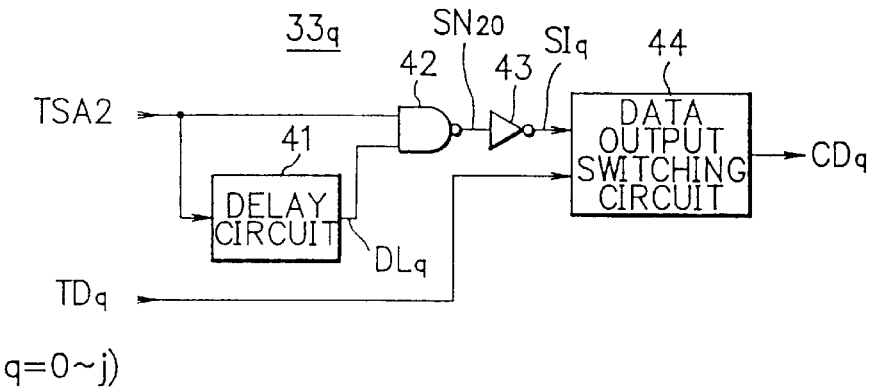
FIG. 11A is a circuit diagram showing a first embodiment of a control circuit in accordance with the present invention.

The control circuit $33_o$ to $33_j$ are equal in configuration with each other. FIG. 11A shows the structure of the first embodiment of the control circuit $33_q$ (q=0 to j). As can be seen from FIG. 11A, the circuit $33_q$ includes a delay circuit 41, a 2-input NAND circuit 42, an inverter 43, and a data output switch circuit 44.

The delay circuit 41 receives as an input thereto the sense amplifier enable signal TSA2 to produce signals $DL_q$ (q=0 to j respectively corresponding to output buffers $34_o$ to $34_j$). The NAND circuit 42 receives the signals TSA2 and $DL_q$ to thereby generate a signal $SN_{20}$. The inverter 43 receives the signal $SN_{20}$ from the NAND circuit 42 to produce a signal $SI_q$ for the data output switch circuit 44. The switch circuit 44 receives the signals $SI_q$ and $TD_q$ to create a control signal $CD_q$, which is then delivered to the pertinent output buffer $34_q$.

Figure 11B:
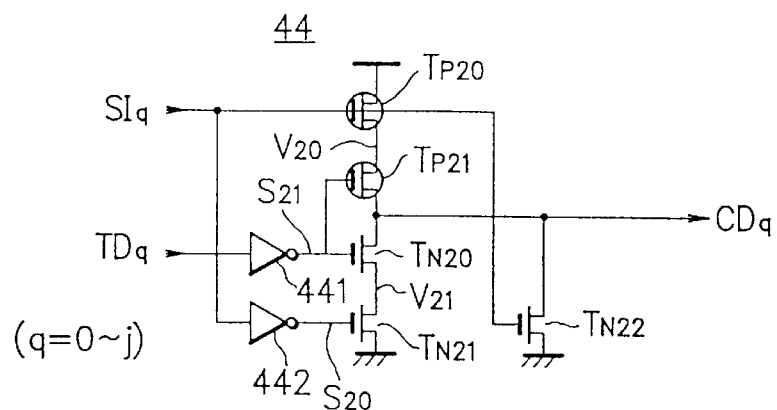
FIGS. 11B and 11C are diagrams respectively showing a data output switch circuit and a delay circuit constituting the control circuit.

FIG. 11B is a circuit diagram showing the first embodiment of the data output switch circuit 44. The circuit 44 includes an inverter 441 which receives the sense amplifier output signal $TD_q$ to create a signal $S_{21}$. The circuit includes a p-channel MOS transistor $T_{P20}$ having a source connected to the $V_{CC}$ power source, a gate input of the switch circuit input signal $SI_q$, and a drain linked with a node $V_{20}$. The circuit further includes a p-channel MOS transistor $T_{P21}$ having a source connected to the node $V_{20}$, a gate input of the inverter output signal $S_{21}$, and a drain output of the buffer control signal $CD_q$, and an n-channel MOS transistor $T_{N20}$ having a drain output of the signal $CD_q$, a gate input of the signal $S_{21}$, and a source connected to the node $V_{21}$. The circuit additionally includes an inverter 442 receiving the signal $SI_q$ and producing a signal $S_{20}$, an n-channel MOS transistor $T_{N21}$ having a drain output connected to the node $V_{21}$, a gate input of the signal $S_{20}$, and a source connected to the GND power source, and an n-channel MOS transistor $T_{N22}$ having a drain output connected to the signal $CD_q$, a gate input of the signal $SI_q$, and a source connected to the GND power source.

Subsequently, description will be given of roles and functions of the delay circuit 41 and data output switch circuit 44 of the control circuit $33_q$. The delay circuit 41 provides a preset delay period of time to the sense amplifier enable signal TSA2. The delay time may be set to each of the output buffers $34_o$ to $34_j$ (i.e., data output signals $D_o$ to $D_j$) in which the values of delay time assigned thereto are mutually different from each other. Alternatively, the buffers $34_o$ to $34_j$ may be classified into groups such that the delay time is set to each of the groups, which will be specifically described. For example, eight output buffers are classified into two groups each including four buffers such that these two groups are assigned with mutually different values of delay time.

Figure 11C:
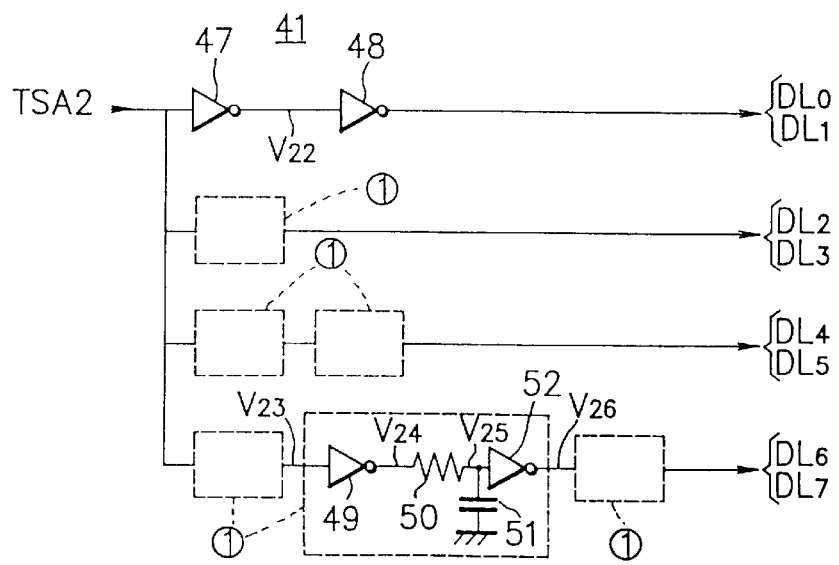

The delay circuit 41 functions to delay for the preset period of time the signal TSA2 input thereto so as to produce a signal $DL_q$. FIG. 11C shows in a circuit diagram the structure of the first embodiment of the delay circuit 41. This embodiment includes eight output buffers $34_0$ to $34_7$ (j=7). Receiving the enable signal TSA2, the circuit produces non-delayed signals $DL_0$ and $DL_1$, signals $DL_2$ and $DL_3$ delayed for $t_o$, signals $DL_4$ and $DL_5$ delayed for $2t_o$, and signals $DL_6$ and $DL_7$ delayed for $3t_o$.

Delay time $t_o$ is created from a circuit section (1)** of FIG. 11C. This section includes an inverter 49 which receives a signal $V_{23}$ to produce a signal $V_{24}$, a resistor element 50 having one end linked with an output terminal of the inverter 49, a capacitor element 51 connected between the other end of the resistor 50 and the GND potential, and an inverter 52 which receives a signal $V_{25}$ to generate a signal $V_{26}$. The delay time $t_o$ can be set in accordance with the time constant of integration determined by the values of the resistor element 50 and capacitor element 51.

**This number appears in a circle in the original specification. Due to technical difficulties, applicant is unable to reproduce that character.

An integral multiple of $t_o$ can be obtained by appropriately arranging the circuit sections () in a series connection. The sections enclosed with the dotted lines of FIG. 11C are of the same configuration. No delay time is set to the signals $DL_0$ and $DL_1$. In this connection, it is desirable to connect an inverter 47 having the characteristic of the inverter 49 to an inverter 48 having the characteristic of the inverter 52 in series so that the delay time is free of any influence from the characteristics of the inverters.

Next, the data output switch circuit 44 serves as follows. During the active period of the sense amplifier $33_q$, the circuit 44 generates a signal which is changed after a fixed period of time to "0" and maintained in this state thereafter. During the nonactive period of the sense amplifier $33_q$, the circuit 44 generates a signal which is in phase with the output signal $TD_q$. The circuit 44 functions to produce the output buffer control signal $CD_q$ of "0" for signal $SI_q=1$ and the signal $CD_q$ which is in phase with the signal $TD_q$ for signal $SI_q=0$.

In the embodiment of the present invention, the delay time $t_o$ is set such that the output buffer control signals $CD_q$ are changed to "0" during the active period of the sense amplifier $33_q$. However, desirably, the delay time $t_o$ is set such that the data latch is enable after the signals $CD_q$ are changed to "0". In this specification, it is assumed herebelow that the delay time $t_o$ is set such that the data latch is enable after all output buffer control signals $CD_q$ are changed to "0".

In the conventional semiconductor device described in the Japanese Patent Laid-Open Publication Ser. No. 3-54795, a delay circuit operating in accordance with an enable signal (the sense amplification enable signal TSA2 in this embodiment) produced from a sense amplifier enable circuit (ATD 31 in this embodiment) is connected to each sense amplifier ($32_o$ to $32_j$ in this specification). In contrast therewith, according to the configuration of the embodiment, the operation is accomplished in accordance with the signal TSA2 from ATD 31 such that the control circuits $33_o$ to $33_j$ receiving the signals $TD_q$ from the amplifiers $32_o$ to $32_j$ are respectively linked with the output buffers $34_o$ to $34_j$. In this point, the device of the present invention is different from the conventional semiconductor device.

Figure 12:
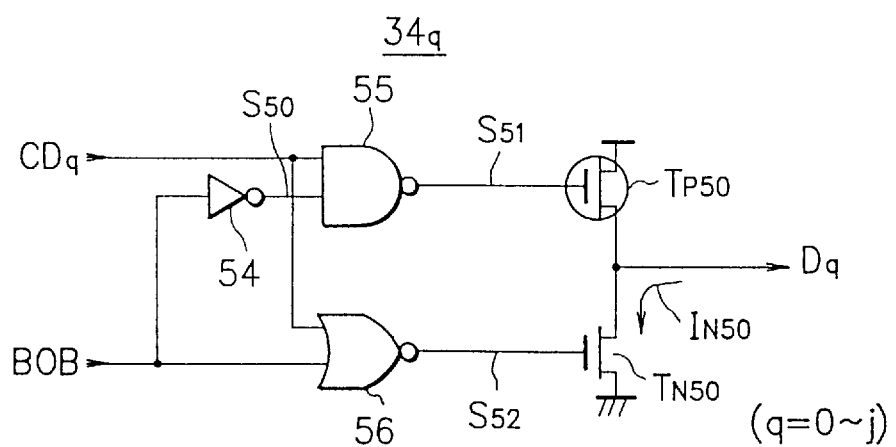
FIG. 12 is a circuit diagram showing an output buffer in the first embodiment in accordance with the present invention.

Subsequently, the circuit layout of the output buffers $34_o$ to $34_j$ will be described. FIG. 12 shows in a circuit diagram the construction of the first embodiment of the output buffer $34_q$. As can be seen from FIG. 12, the buffer $34_q$ includes an inverter 54 which receives the output buffer enable signal BOB to produce a signal $S_{50}$, an NAND circuit 55 which receives the signals $CD_q$ and $S_{50}$ and which generates a signal $S_{51}$, an NOR circuit 56 which receives the signals $CD_q$ and BOB to create a signal $S_{52}$, a p-channel MOS transistor $T_{P50}$ having a source linked with the $V_{CC}$ power source, a gate input of the signal $S_{51}$, and a drain output of the signal $D_q$; and an n-channel MOS transistor $T_{N50}$ having a source linked with the GND power source, a gate input of the signal $S_{52}$, and a drain output of the signal $D_q$.

Next, description will be given of roles of the control circuits $33_o$ to $33_j$ and the output buffers $34_o$ to $34_j$. During the active period of sense amplifiers $32_o$ to $32_j$, the control circuits $33_o$ to $33_j$ produce signals which are changed to "0" ("L" level) with a fixed difference of time therebetween and are maintained in that state thereafter. During the nonactive period of sense amplifiers $32_o$ to $32_j$, the control circuits $33_o$ to $33_j$ supply the output buffers $34_o$ to $34_j$ respectively with the output buffer control signals $CD_q$ which are in phase with data items read from the amplifiers $32_o$ to $32_j$. During the active period of sense amplifiers $32_o$ to $32_j$, the signals $CD_q$ may be changed to "0" in a signal-by-signal manner. Or, the signals may be classified into groups such that the change takes place in the group-by-group fashion. In this regard, when the data occurring before the enablement of amplifiers $32_o$ to $32_j$ is "0", the signals $CD_q$ is kept fixed at "0" during the active period.

Additionally, in the active state, the output buffers $34_o$ to $34_j$ deliver readout data sent from the control circuits $33_o$ to $33_j$ to an external device. In the active state, the output enable signal OE is "0", namely, the output buffer enable signal BOB is "0".

Subsequently, description will be given of functions of the control circuits $33_o$ to $33_j$ and output buffers $34_o$ to $34_j$. During the active period of sense amplifiers $32_o$ to $32_j$, the control circuits $33_o$ to $33_j$ change the output signals $CD_q$ to "0" with a fixed discrepancy of time therebetween and maintain the signals in this state. During the nonactive period of sense amplifiers $32_o$ to $32_j$, the control circuits $33_o$ to $33_j$ produce the output signals $CD_q$ which are in phase with the sense amplifier output signals $TD_q$. In the output buffer active state, the buffers $34_o$ to $34_j$ output signals in phase with the signals $CD_q$ from the control circuits $33_o$ to $33_j$. In the output buffer nonactive state, the buffers $34_o$ to $34_j$ deliver signals at an intermediate potential.

Referring now the block diagram of FIG. 10 and the circuit configurations of FIGS. 11A to 11C and FIG. 12, description will be given of operation of the first embodiment in accordance with the present invention.

In the embodiment, like in the conventional semiconductor device, when the X address signal $A_x$ and the Y address signal $A_y$ are specified by the chip enable signal CE set to "0", the sense amplifier enable signal TSA2 from ATD 31 is changed from "0" ("L" level) to "1" ("H" level). In response thereto, the sense amplifier $32_o$ to $32_j$ start a memory cell data read operation.

Figure 13:
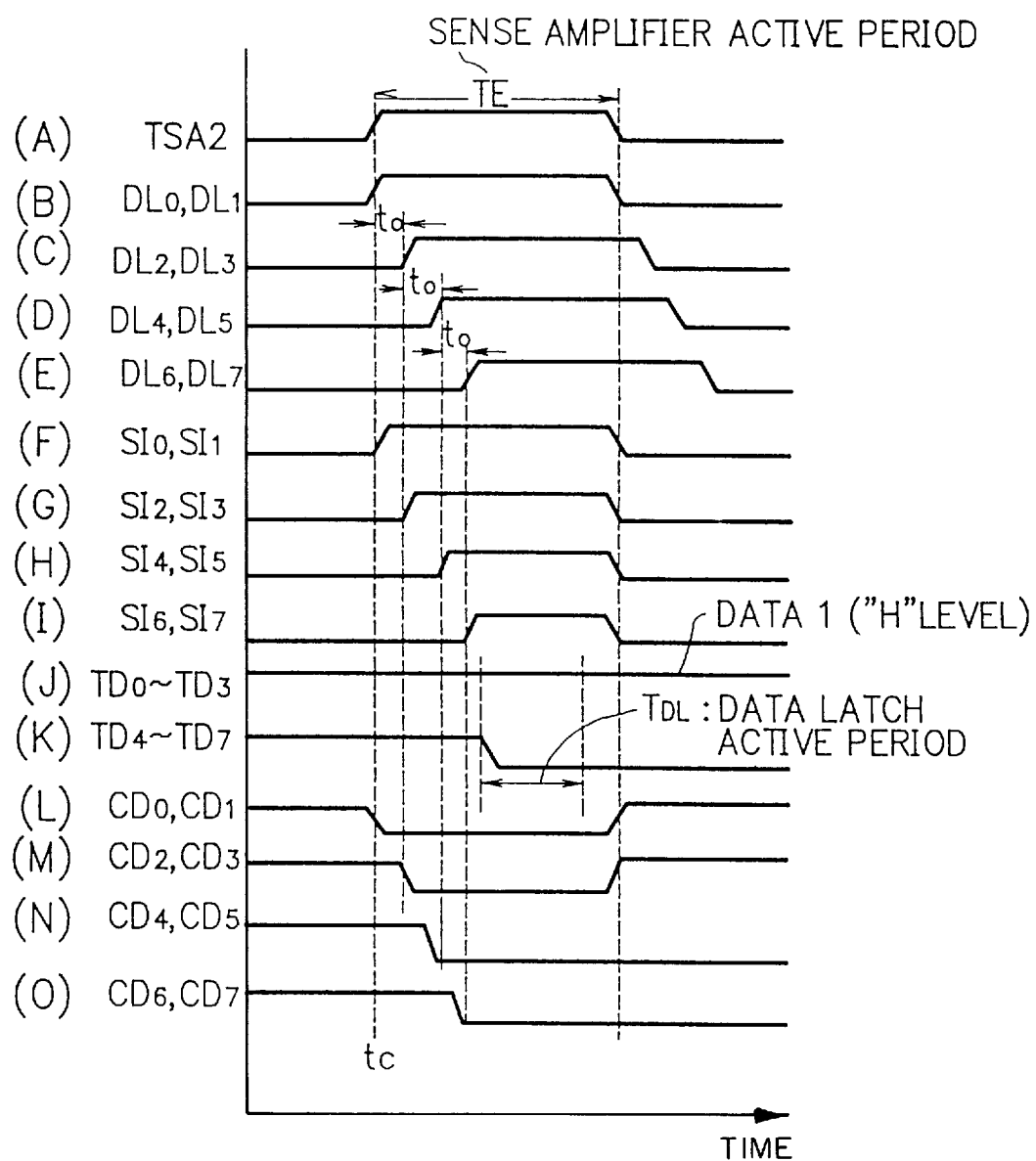
FIG. 13 is a graph showing waveforms of primary signals for explaining operation of the first embodiment in accordance with the present invention.
Figure 14:
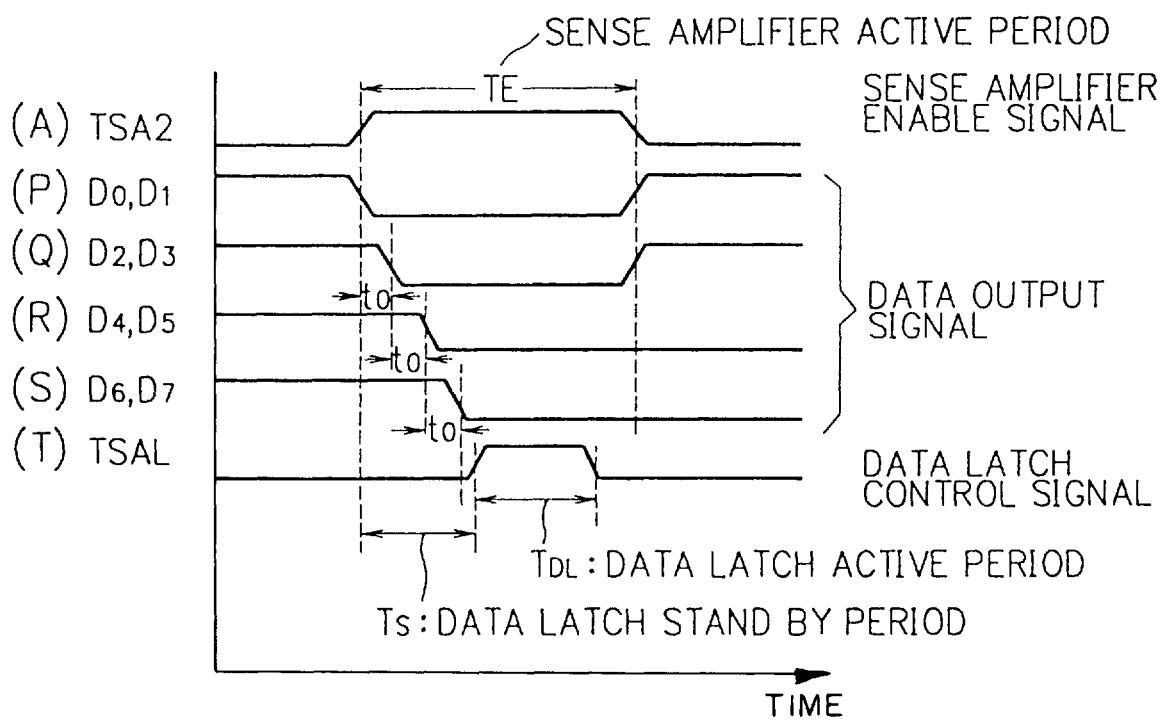
FIG. 14 is a graph showing waveforms of primary signals for explaining operation of the first embodiment in accordance with the present invention.

FIGS. 13 and 14 are graphs showing waveforms of primary signals before, during, and after the active period of sense amplifiers $32_o$ to $32_j$. In this description, eight output buffers $34_0$ to $34_7$ are classified into four groups each including two buffers. However, the number of output buffers $34_o$ to $34_j$ and that of the buffer groups may be arbitrarily specified.

During the sense amplifier active period, the signal TSA2 of (A) in FIG. 13 is "1" ("H" level). When the signal TSA2 is changed from "0" to "1" at time tc, the signals $CD_0$ to $CD_7$ from the control circuits $33_0$ to $33_7$ are altered as follows. Namely, the signals $CD_0$ and $CD_1$ are changed from "1" to "0" with delay time="0", namely, at time tc as shown in (L) to (O) of FIG. 13. When time $t_o$ lapses relative to time tc, the signals $CD_2$ and $CD_3$ are altered from "1" to "0". Similarly, when time $2t_o$ and $3t_o$ lapse after time tc, the signals $CD_4$ and $CD_5$ and the signals $CD_6$ and $CD_7$ are respectively varied from "1" to "0".

The signals $TD_0$ to $TD_7$ from the sense amplifiers $32_0$ to $32_7$ are fed to the controllers $33_0$ to $33_7$, respectively. The signals $TD_0$ to $TD_7$ are data signals obtained from the pertinent memory cells during the active period TE (reference is to be made to (J) and (K) of FIG. 13). When the enable period is completed and the operation to read data from the memory cells are terminated, the controllers $33_0$ to $33_7$ output as the output buffer control signals $CD_0$ to $CD_7$ the data items attained from the memory cells. That is, the signals $CD_0$ to $CD_7$ are in phase with the signals $TD_0$ to $TD_7$.

The control signals $CD_0$ to $CD_7$ are supplied to the output buffers $34_0$ to $34_7$. These buffers are enable when the enable signal OE is "0" to output the data from the memory cells to an external device. The buffers produce signals at an intermediate potential when the signal OE is "1". In this description, OE="0" is assumed. On receiving the signals $CD_0$ to $CD_7$, the output buffers $34_0$ to $34_7$ output data output signals $D_0$ to $D_7$ which are sequentially changed to "0" ("L" level) during the enable period TE (reference is to be made to (P) to (S) of FIG. 14).

When the enable period is finished and the read data items from the memory cells are determined, the buffers output the data items from the memory cells, namely, the signals $D_0$ to $D_7$ which are in phase with the output signals $TD_0$ to $TD_7$.

The embodiment of the present invention includes, like the conventional semiconductor device, data latches therein. Therefore, before the data latch enable period $T_{DL}$ is started, the data items latched in the data latches before the enable of the amplifiers $32_0$ to $32_7$ are outputted as the signals $TD_0$ to $TD_7$ (reference is to be made to (J) and (K) of FIG. 13).

Referring to FIGS. 11A and 13, description will be given in more detail of operation of the control circuits $33_0$ to $33_7$. At start of the read operation, when the signal TSA2 is altered from "0" to "1" at time tc as shown in (A) of FIG. 13, the delay circuit 41 delays the signals TSA2 for a preset delay period of time to thereby produce signals $DL_0$ to $DL_7$ as shown in (B) to (E) of FIG. 13 (j=7 in this case).

The NAND circuit 42 receives as inputs thereto the signals $DL_0$ to $DL_7$ from the delay circuit 41 and the enable signal TSA2 and then produces and supplies an output signal $SN_{20}$ to the data output switch circuit 44. The signals $SI_q$ (q=0 to 7) from the inverter 43 are changed from "0" to "1" at the same time together with the signal $DL_q$ from the delay circuit 41 as indicated by (F) to (I) of FIG. 13. When the signal TSA2 is varied from "1" to "0", these signals $SI_q$ are altered from "1" to "0" at the same time. The signals $SI_q$ and the output signals $TD_q$ are fed to the switch circuit 44.

Operation of the data output switch circuit 44 will be now described. The circuit 44 is constructed as shown in FIG. 11B in which when the signal $SI_q$ is varied to "1" at the sense amplifier enable, the inverter output signal $S_{20}$ is set to "0" and hence the transistor $T_{N21}$ becomes nonconductive. Moreover, since the transistors $T_{P20}$ and $T_{N22}$ receiving the signal $SI_q$ via the respective gates are respectively nonconductive and conductive, the output buffer control signals are set to "0" ("L" level).

Since the signal $SI_q$ is "0" during the sense amplifier nonactive period, the transistors $T_{P20}$ and $T_{N21}$ are conductive and hence the transistors $T_{P21}$ and $T_{N20}$ operate as an inverter. In this state, the transistor $T_{N22}$ is nonconductive. Consequently, the phase of the signal $TD_q$ is reversed by the inverter 441 and then is again inverted by a circuit including $T_{P21}$ and $T_{N20}$ to be delivered from the drain thereof as the output buffer control signals $CD_q$. Therefore, the signals $CD_q$ are in phase with the signals $TD_q$. Waveforms of signals $CD_0$ to $CD_7$ are shown in (L) to (O) of FIG. 13.

Shown in (J) of FIG. 13 are the output signals $TD_0$ to $TD_3$ of which the data value is "1". Similarly, the output signals $TD_4$ to $TD_7$ are shown in (K) of FIG. 13 of which the data value is changed from "1" to "0" when the data latch enable period $T_{DL}$ is initiated. The control signals $CD_0$ to $CD_7$ in this state are shown in (L) to (O) of FIG. 13 in which the values thereof are sequentially altered from "1" to "0" with a difference of time therebetween. When the enable period TE is completed and the sense amplifier nonactive period is commenced, the values are changed to the data value of signals $TD_0$ to $TD_7$. Namely, when the sense amplifier nonactive period is started, the signals $CD_0$ to $CD_3$ are changed from "0" to "1", whereas the signals $CD_4$ to $CD_7$ are kept retained at "0".

In FIG. 13, since the sense amplifier output signals $TD_0$ to $TD_7$ are "1" before the sense amplifiers are enable, the values of $CD_0$ to $CD_7$ are varied from "1" to "0" at initiation of the sense amplifier enable period. However, when either one of the sense amplifier output signals $TD_q$ (q=0 to 7) is "0" before the sense amplifier enable is commenced, the value of the associated signals $CD_q$ (q=0 to 7) is kept fixed at "0".

Referring next to FIGS. 12 and 14, description will be given in detail of operation of the output buffers $34_o$ to $34_j$ (j=7 in this case). In the nonactive state of buffers $34_o$ to $34_j$, i.e., when the enable signal BOB is "1", the inverter output signal $S_{50}$ is "0" in the output buffers $34_q$ (q=0 to 7), the NAND output signals $S_{51}$ is "1", and the NOR output signal $S_{52}$ is "0". Therefore, the transistors $T_{P50}$ and $T_{N50}$ are nonconductive and the output signals $D_q$ are at an intermediate potential.

On the other hand, in the active state of the buffers $34_q$, namely, when the enable signal BOB is "0", the inverter output signal $S_{50}$ is "1" and the phase of the NAND output signals $S_{51}$ and NOR output signal $S_{52}$ is opposite to that of the control signals $CD_q$. Therefore, the output signals $D_q$ are in phase with the signals $CD_q$.

Shown in (P) to (S) of FIG. 14 are waveforms of the signals $D_0$ to $D_7$ corresponding to the control signals $CD_0$ to $CD_7$ in (L) to (O) of FIG. 13. In this connection, the waveforms of FIG. 14 are obtained when the enable signal BOB is "0", i.e., in the output buffer activate state. The data value before the sense amplifier enable is "1". In response to the enable of sense amplifiers, the signals $D_0$ to $D_7$ are consecutively varied from "1" to "0" with a difference of time $t_o$. When the active period TE is completed and the sense amplifier nonactive period is initiated, the data values of output signals $TD_0$ to $TD_7$ are outputted. That is, $D_0$ to $D_3$ are changed from "0" to "1" as shown in (P) and (Q) of FIG. 14, whereas $D_4$ to $D_7$ are kept remained at "0" as shown in (R) and (S) of FIG. 14. With the operation above, the read operation is completed.

The delay time $t_o$ is set such that all of data output signals $D_0$ to $D_7$ are changed to "0" during the data latch standby period ($T_s$ in (T) of FIG. 14). Moreover, according to an aspect of the embodiment, the signal $D_q$ is varied to "0" during the sense amplifier active period. Consequently, the output buffers $34_q$ are required to be active at initiation of the sense amplifier active period.

Figure 15:
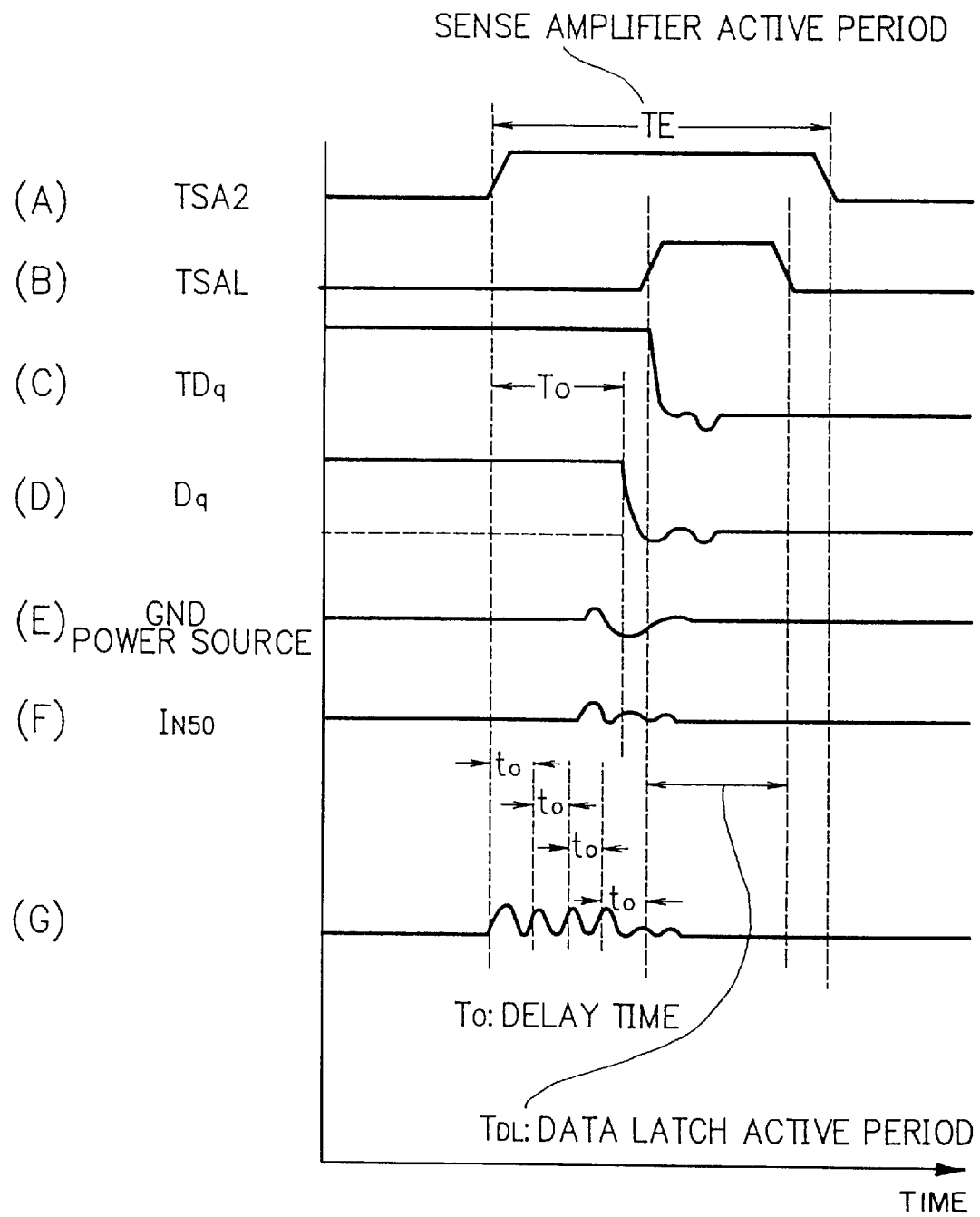
FIG. 15 is a graph showing waveforms of primary signals for explaining the operation and effect of the first embodiment in accordance with the present invention.

Referring now to FIG. 15, description will be given of advantages of the first embodiment in accordance with the present invention. In the first embodiment, as already described in conjunction with FIG. 14 and the like, the data output signals $D_q$ are forced to "0" during the sense amplifier active period TE. Therefore, regardless of the data values of sense amplifier output signals $TD_q$, the signals $D_q$ are sequentially fixed during the period TE (reference is to be made to (A) and (D) of FIG. 15). In consequence, when the expected values of signals $D_q$ are "0", the output signals $D_q$ is maintained at "0".

Thereafter, the data latch control signal TSAL shown in (B) of FIG. 15 is altered from "0" to "1" to initiate the data latch active period in which the signals $TD_q$ are varied from "1" to "0" as shown in (C) of FIG. 15. After the control signal TSAL is changed from "1" to "0", the data latch active period $T_{DL}$ is terminated.

During the sense amplified active period TE, when the signals $D_q$ before the sense amplifier enable are "1", the discharge current $I_{N50}$ delivered to the GND power source is as shown in (F) of FIG. 15 for one output buffer circuit since the data output signals $D_q$ are altered to "0" in a signal-by-signal manner or for each signal group as described above. Namely, when all signals $D_q$ are simultaneously varied from "1" to "0", the total value of discharge current flowing through the transistor $T_{N50}$ of FIG. 12 of each output buffer $34_q$ is dispersed as shown in (G) of FIG. 15. Accordingly, the peak value of $I_{N50}$ is minimized when compared with the conventional semiconductor device and hence the deviation in the GND power source is suppressed as shown in (E) of FIG. 15.

In the example of FIG. 15, thanks to provision of four signal groups, the magnitude of variation in the GND power source is lowered to about one quarter of that of the conventional semiconductor device. In short, a first advantage of the embodiment resides in that the noise of power source (deviation of GND power source) is suppressed to prevent any operation errors related to the noise.

Moreover, a second advantage of the embodiment is as follows. The operation in which the data output signals $D_q$ (or the data output signal groups) are sequentially varied to "0" with a difference of time therebetween is carried out during the sense amplifier active period TE, particularly, during the data latch standby period. This solves the problem of delay in the read time due to the difference of time. This advantage removes the problem of the conventional semiconductor described in the Japanese Patent Laid-Open Publication Ser. No. 3-54795 in which a difference of time is provided when the sense amplifiers are enabled to disperse the discharge current so as to suppress the power source noise.

In this connection, when the signals $D_q$ are fixed to "0" during the data latch standby period, it is possible to latch data in a stable state, which improves reliability of the data latch operation. Thanks to the first and second advantages, there is obtained higher reliability in the read operation when a plurality of data values are changed from "1" to "0" at the same time.

Second Embodiment

Next, the second embodiment will be described in accordance with the present invention. This embodiment differs from the first embodiment in the roles, functions, and circuit configurations of the control circuits $33_o$ to $33_j$ and output buffers $34_o$ to $34_j$.

First, description will be given of the roles of the control circuits and the output buffers in the second embodiments. Each of the control circuits $33_o$ to $33_j$ produces a control signal to alter, between the active and nonactive period of the pertinent sense amplifier ($32_o$ to $32_j$), the capacitance of the n-channel MOS transistor of the final stage of the associated output buffer ($34_o$ to $34_j$). Moreover, the control circuit supplies the associated output buffer ($34_o$ to $34_j$) with a signal which is "0" during the sense amplifier active period and which is in phase with readout data obtained by the pertinent sense amplifier ($32_o$ to $32_j$).

The output buffers $34_o$ to $34_j$ output data items respectively supplied from the control circuits $33_o$ to $33_j$ in the output buffer active state. In this state, the output buffer enable signal BOB is "0".

Subsequently, description will be given of functions of the control circuits $33_o$ to $33_j$ and the output buffers $34_o$ to $34_j$. The control circuits $33_o$ to $33_j$ produce output buffer control signals $CD_{oq}$ (q=0 to j respectively corresponding to buffers $34_o$ to $34_j$) which are "0" during the sense amplifier active period and which are "1" during the sense amplifier nonactive period. Moreover, the controllers generate output buffer control signals $CD_{1q}$ which are "0" during the active period and which are in phase with the signals $TD_q$ during the nonactive period.

In the output buffer nonactive state, the buffers $34_o$ to $34_j$ produce the signals $D_q$ at an intermediate potential. In the output buffer active state, the buffers $34_o$ to $34_j$ produce the signals $D_q$ which are gradually set to "0" during the sense amplifier active period TE and which are in phase with the signals $TD_q$ during the sense amplifier nonactive period.

Figure 16A:
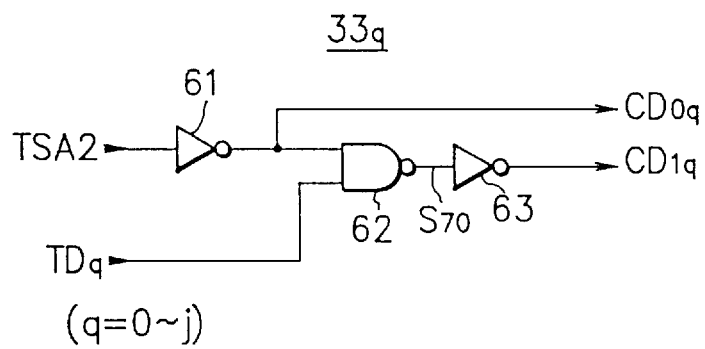
FIGS. 16A and 16B are diagrams respectively showing a control circuit and an output buffer in a second embodiment in accordance with the present invention.

Subsequently, description will be given of the circuit configurations of the control circuits $33_o$ to $33_j$ and the output buffers $34_o$ to $34_j$. FIG. 16A shows in a circuit diagram the constitution of the second embodiment of the control circuit $33q$ (q=0 to j). The control circuit $33_q$ includes an inverter 61 which receives the sense amplifier enable signal TSA2 to produce an output buffer control signal $CD_{0q}$, and NAND circuit 62 which receives the signals $CD_{0q}$ and $TD_q$ and which creates a signal $S_{70}$, and an inverter 63 which receives the signal $S_{70}$ to output a buffer control signal $CD_{1q}$.

Figure 16B:
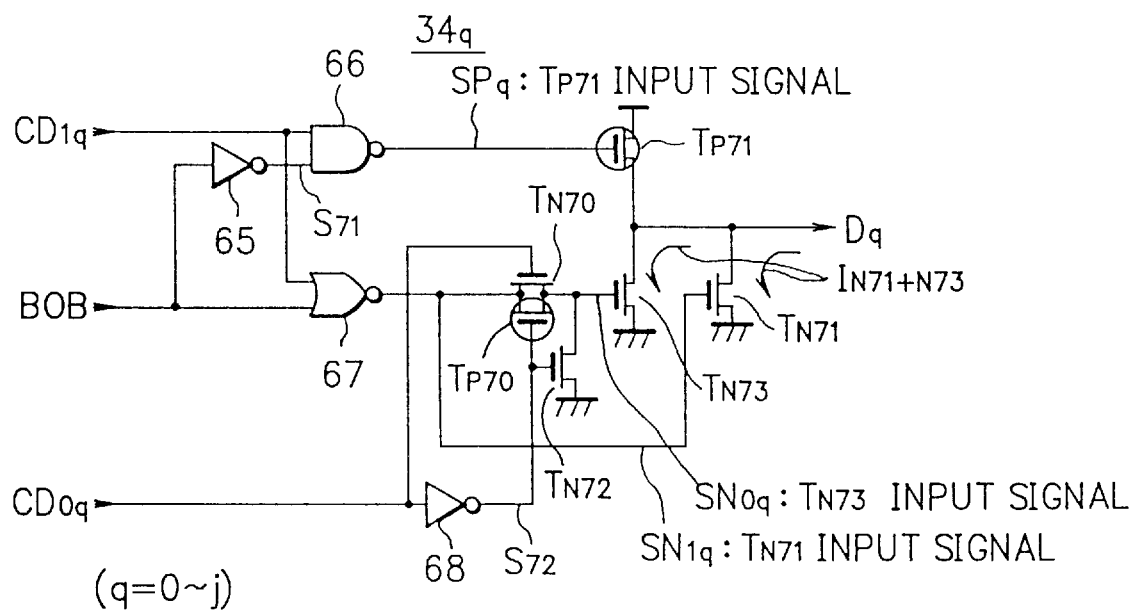

FIG. 16B shows the circuit layout of the second embodiment of the output buffer $34_q$. The buffer $34_q$ includes an inverter 65 which receives the output buffer enable signal BOB and which produces a signal $S_{71}$, an NAND circuit 66 which receives the signals $CD_{1q}$ and $S_{71}$ to create a signal $SP_q$, an NOR circuit 67 which receives the signals $CD_{1q}$ and BOB to output a signal $SN_{1q}$, an inverter 68 which inputs the signal $CD_{0q}$ to produce a signal $S_{72}$, a transfer gate including a p-channel MOS transistor $T_{P70}$ and an n-channel MOS transistor $T_{N70}$ to produce a signal $SN_{0q}$, an n-channel MOS transistor $T_{N72}$, an n-channel MOS transistor $T_{N73}$, a p-channel MOS transistor $T_{P71}$, and an n-channel MOS transistor $T_{N71}$.

Figure 8A:
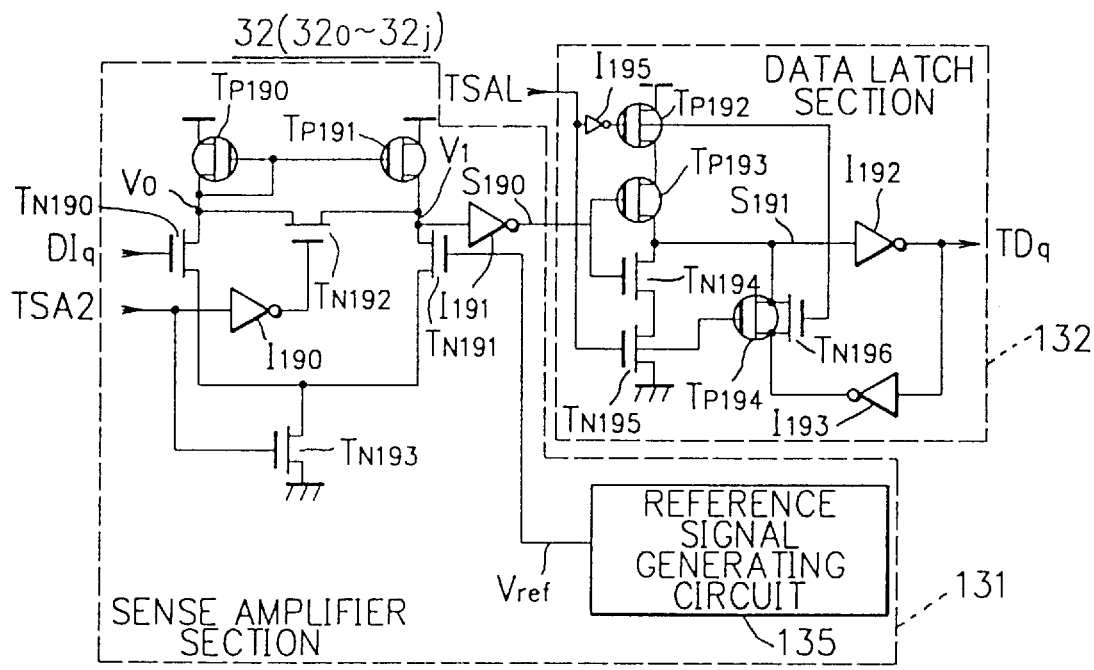
FIGS. 8A and 8B are circuit diagrams showing examples of the sense amplifier and the output buffer of the prior art.
Figure 8B:
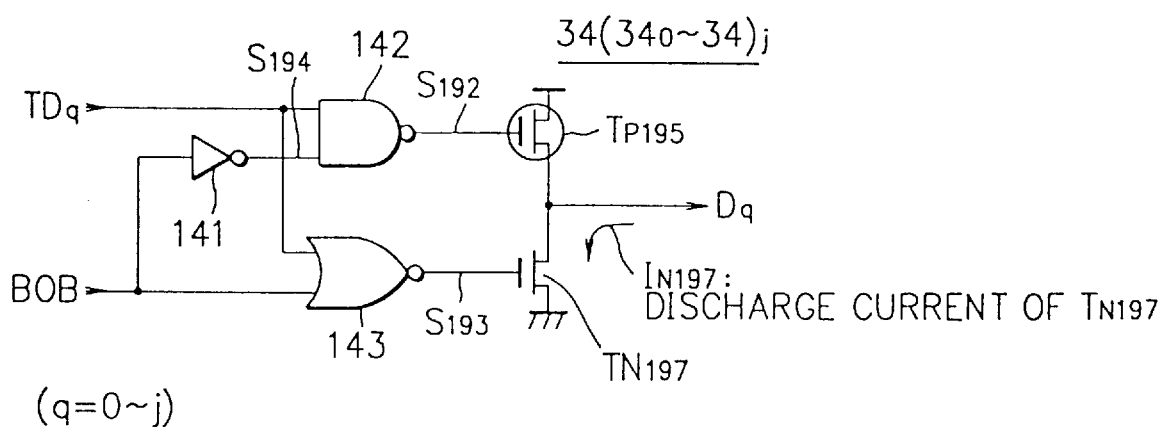

It is assumed that the combination of transistors $T_{N71}$ and $T_{N73}$ performs almost the same as that of $T_{N197}$ of the conventional semiconductor (FIG. 8B). Moreover, drains and sources respectively of the transistors $T_{P70}$ and $T_{N70}$ are respectively shared therebetween. Receiving the signal $SN_{1q}$, the circuit produces a signal $SN_{0q}$. The transistors $T_{N72}$ and $T_{N73}$ include gates respectively receiving the signals $S_{72}$ and $SN_{0q}$ and sources connected to the GND potential (i.e., grounded). The transistor $T_{N71}$ includes a gate input of the signal $SN_{1q}$, a drain receiving the signal $D_q$, and a source linked with the GND power source (grounded). The transistor $T_{P71}$ includes a gate supplied with the signal $SP_q$, a source receiving the $V_{CC}$ power source, and a drain coupled with the drains of transistors $T_{N73}$ to $T_{N71}$.

Figure 17:
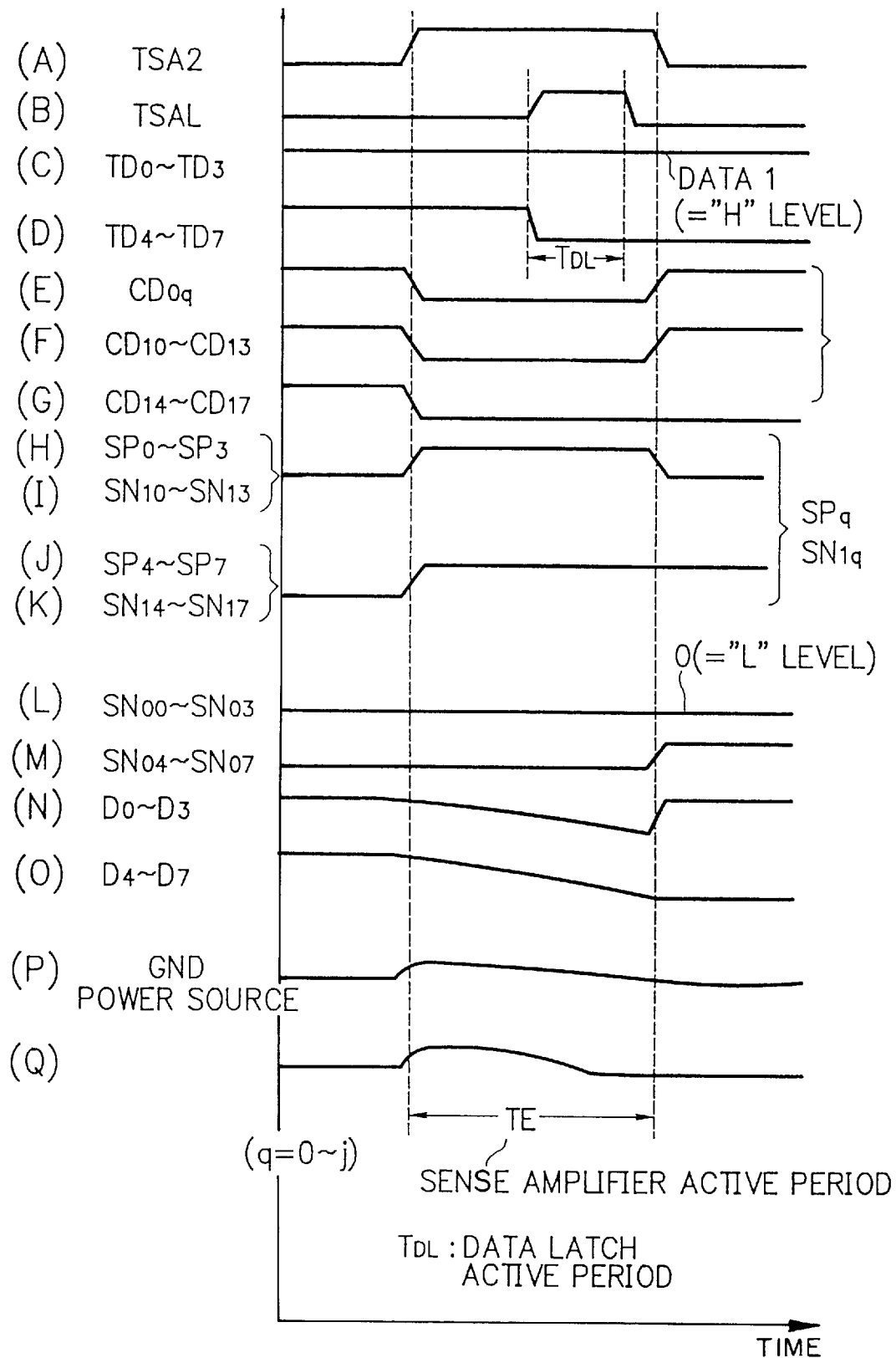
FIG. 17 is a graph showing waveforms of primary signals for explaining operation of a second embodiment in accordance with the present invention.

Next, description will be given of an outline of operation of the second embodiment in accordance with the present invention. FIG. 17 shows the waveforms of primary signals before, during, and after the active period of sense amplifiers $32q$. When a read operation is started and the signals TSA2 ((A) of FIG. 17) is altered from "0" to "1", all signals $CD_{0q}$ from the controllers $33_q$ are varied from "1" to "0" ((E) of FIG. 17). At the same time, the signals $CD_{1q}$ from the controllers $33_q$ are changed from the values thereof before the sense amplifier enable to "0" as shown in (F) and (G) of FIG. 17. In this case, the control signals $CD_{1q}$ include four signals $CD_{10}$ to $CD_{13}$ and four signals $CD_{14}$ to $CD_{17}$.

In this situation, when the output buffers $34_q$ are in the active state (the enable signal BOB is "0"), the levels of the signals $D_q$ gradually approach to "0" in response to control signals $CD_{0q}$ and $CD_{1q}$ ((N) and (O) of FIG. 17).

When the active period TE is finished and the signal TSA2 is changed from "1" to "0", the control signals $CD_{0q}$ are varied from "0" to "1" as shown in (E) of FIG. 17. At the same time, the control signals $CD_{1q}$ are altered from "0" to a value in phase with the output signals $TD_q$ as shown in (F) and (G) of FIG. 17. When the buffers $34_q$ are in the active state in this situation, the output signals $D_q$ are set to values in phase with the output signals $TD_q$, namely, the data values read from the memory cells during the active period of sense amplifiers $32_q$.

As above, according to an aspect of the embodiment, the data output signal $D_q$ are gradually altered to "0" during the sense amplifier active period TE such that the data obtained during the active period is outputted when the active period is terminated. Therefore, at initiation of the sense amplifier active period, the output buffers $34_q$ are required to be enabled.

Referring now to the circuits shown in FIGS. 16A and 16B and the waveforms of FIG. 17, description will be given in detail of operation of the second embodiment. In the controllers $33_q$ of FIG. 16A, since the signal TSA2 is "1" during the active period TE, the control signals $C_{0q}$ from the inverter 61 are "0" as shown in (E) of FIG. 17. In this state, the signal $S_{70}$ from the NAND circuit 62 is "1". The phase of the signal $S_{70}$ is then reversed by the inverter 63 into control signals $CD_{1q}$ which are "0" as shown in (F) and (G) of FIG. 17.

When the active period TE is completed, the signals TSA2 are set to "0" and hence the control signals $CD_{0q}$ are changed to "1" ((E) of FIG. 17). On this occasion, since the phase of signal $S_{70}$ is opposite to that of the output signals $TD_q$, the control signals $CD_{1q}$ are in phase with the signals $TD_q$. Assume that among the sense amplifier output signals $TD_q$ including $TD_0$ to $TD_7$, the signals $TD_0$ to $TD_3$ are "1" ((C) of FIG. 17) and the signals $TD_4$ to $TD_7$ are changed from "1" to "0" ((D) of FIG. 17). The output control signals $CD_{1q}$ are produced in this case as follows. The signals $CD_{10}$ to $CD_{13}$ are "1" ((F) of FIG. 17) and the signals $CD_{14}$ to $CD_{17}$ are changed to "0" ((G) of FIG. 17).

Figure 7:
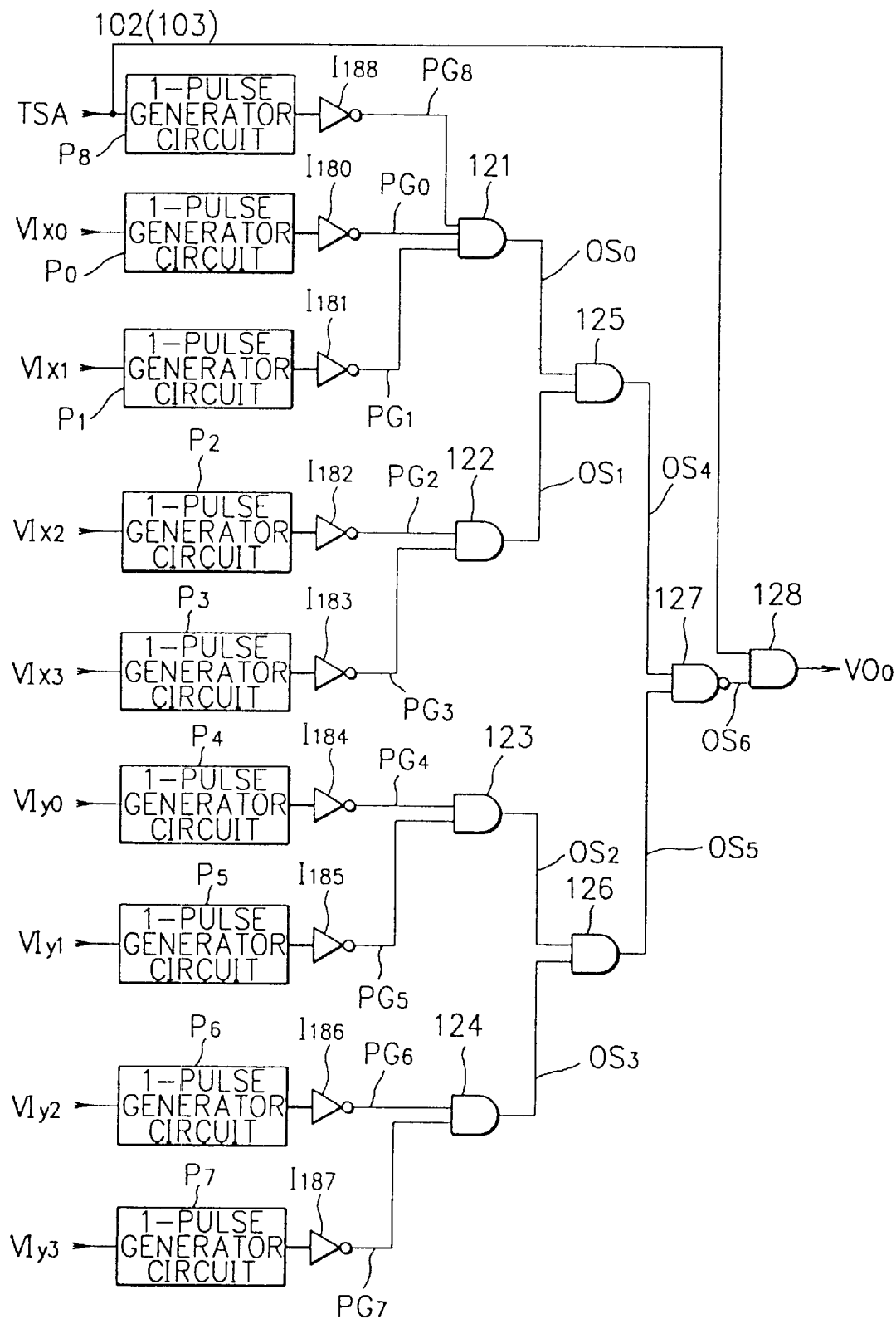
FIG. 7 is a circuit diagram showing an example of the conventional signal composing circuit.

Assume in the buffers $34_q$ of FIG. 16B that the signal BOB is "0" and the buffers $34_q$ are in the active state. The signal $S_{71}$ is obtained by reversing the phase of the signal BOB by the inverter 65 and is therefore "1". During the active period TE, the control signals $CD_{0q}$ are "0" ((E) of FIG. 1 7) and the signal $S_{72}$ attained by inverting the phase of $CD_{0q}$ by the inverter 68 is "1". As a result, the transistors $T_{P70}$ and $T_{N70}$ are nonconductive and the transistor $T_{N72}$ is conductive.

Consequently, the drain potential (signal $SN_{0q}$) of $T_{N72}$ is "0" ((L) and (M) of FIG. 17) during the active period TE. The transistor $T_{N73}$ receiving $SN_{N0q}$ via its gate is nonconductive. Additionally, since the control signals $CD_{1q}$ are "0" as described above, the signal $SP_q$ from the NAND circuit 66 is set to "1" ((H) and (J) in FIG. 17). The transistor $T_{P71}$ receiving $SP_q$ via its gate is nonconductive.

At the same time, the signal $SN_{1q}$ from the NOR circuit 67 is "1" ((I) and (K) of FIG. 17) during the active period TE and hence the transistor $T_{N71}$ is conductive. Resultantly, a discharge current is delivered through the drain and source of the transistor $T_{N71}$ and the data output signals $D_q$ from the buffers $34_q$ become "0".

As above, the performance of the transistors $T_{N71}$ and $T_{N73}$ is assumed to be substantially equal to that of the n-channel MOS transistor ($T_{N197}$ of FIG. 8B) in the final output stage of the conventional semiconductor device. Moreover, it is assumed that the transistors $T_{N73}$ and $T_{N71}$ respectively have gate lengths of about 200 micrometers and about 100 micrometers when the transistor $T_{N197}$ has a gate length of about 300 micrometers in this embodiment (the gate widths thereof are substantially identical to each other). That is, during the sense amplifier active period in which only the transistor $T_{N71}$ is conductive, the capability of lowering the levels of data output signals $D_q$ to "0" is assumed in this embodiment to be only about one third of that of the conventional semiconductor.

In this embodiment, therefore, the signals $D_q$ are gradually changed to "0" ((N) and (O) of FIG. 17) during the active period TE in a period of time which is about three times that of the conventional semiconductor device. The period of time necessary to alter the signals $D_q$ from "1" to "0" is arbitrarily varied in accordance with the specifications of performance of the transistors $T_{N73}$ and $T_{N71}$.

When the active period TE is completed, the control signals $CD_{0q}$ is "1" and the signal $S_{72}$ is "0". As a result, the transistors $T_{P70}$ and $T_{N70}$ are conductive and the transistor $T_{N72}$ is nonconductive.

In addition, output as the control signals $CD_{1q}$ are the data items read from the memory cells during the active period TE, namely, the sense amplifier output signals $TD_q$.

Therefore, as shown in (H) and (K) of FIG. 17, the phase of signals $SP_q$ from the NAND circuit 66 and that of signals $SN_{1q}$ from the NOR circuit 67 are opposite to the phase of the readout data items (output signals $TD_q$). In this situation, since the transfer gate including $T_{P70}$ and $T_{N70}$ is conductive, the signals $SN_{1q}$ appear as signals $SN_{0q}$ through the transfer gate. Namely, the phase of signals $SN_{0q}$ are also opposite to that of the readout data items as shown in (L) and (M) of FIG. 17.

In consequence, when the anti-phase signal of the readout data item is "1", the transistor $T_{P71}$ is nonconductive and the transistors $T_{N71}$ and $T_{N73}$ are conductive and hence a discharge current is fed through the transistors $T_{N71}$ and $T_{N73}$ and the data output signals $D_q$ become "0". On the other hand, when the anti-phase signal of the readout data item is "0", the transistor $T_{P71}$ is conductive and the transistors $T_{N71}$ and $T_{N73}$ are nonconductive and hence the power source voltage $V_{CC}$ is supplied from the transistor $T_{N71}$ and the data output signals $D_q$ are "1". In short, during the sense amplifier nonactive period, the data output signals $D_q$ take a logical value equal to that of data items read from the memory cells (signals $TD_q$). Moreover, the performance of the final output stage is substantially equal to that of the conventional semiconductor device.

In the example of FIG. 17, the data latch control signal TSAL of (B) of FIG. 17 is altered from "0" to "1" during the sense amplifier active period TE such that when the data latch active period is commenced, the output signals $TD_0$ to $TD_3$ are retained at "1" ((C) of FIG. 17) and the output signals $TD_4$ to $TD_7$ are varied from "1" to "0" ((D) of FIG. 17). The data latch active period $T_{DL}$ is completed when the signal TSAL is changed from "1" to "0".

In this case, during the active period TE, the signals $D_0$ to $D_3$ and $D_4$ to $D_7$ are changed to "0" ((N) and (O) of FIG. 17). Consequently, when the period TE is finished, the signals $D_0$ to $D_3$ are altered from "0" to "1", i.e., the level of the signals $TD_0$ to $TD_3$ ((N) of FIG. 17). The signals $D_4$ to $D_7$ are maintained at "0", i.e., the level of the signals $TD_4$ to $TD_7$ ((O) of FIG. 17). The read operation is terminated at this point.

In the output buffer nonactive state, namely, when the output buffer enable signal BOB is "1", the signals $SP_q$ are "1" and the signals $SN_{0q}$ and $SN_{1q}$ are "0". Therefore, the transistors $T_{N71}$, $T_{N73}$ and $T_{P71}$ are nonconductive and the data output signals $D_q$ are at an intermediate potential.

The second embodiment of the present invention has the same advantages as those of the first embodiment. In the second embodiment, as can be seen from (N) and (O) of FIG. 17, all data output signals $D_q$ are gradually changed to "0" in a relatively long period of time during the sense amplifier active period TE. In this operation, the discharge current fed through the transistor $T_{N71}$ (FIG. 16B) is slowly, i.e., not abruptly, altered as shown in ((Q) of FIG. 17). This prevents the event in which the discharge current is abruptly delivered to the GND power source when a plurality of data output signals $D_q$ are simultaneously varied from "1" to "0". The variation in the GND potential can, as a result, be suppressed as shown in (P) of FIG. 17.

In short, a first advantage of the second embodiment is to minimize the noise in the power source so as to prevent any operation errors due to such noise. A second advantage thereof is that the operation error due to the noise appearing in the power source can be prevented without lowering the read speed.

Third Embodiment

Description will now be given of the third embodiment in accordance with the present invention. In the first embodiment, description has been given of a case in which noise components easily appear in the GND power source and the data values are changed from "1" to "0" are treated. In contrast therewith, in accordance with the third embodiment which is a variation of the first embodiment, noise components easily appear in the $V_{CC}$ power source and operation errors taking place when the data values are altered from "0" to "1" are prevented by configuring the control circuits $33_o$ to $33_j$ to sequentially vary the output buffer control signals $CD_q$ to "1" during the sense amplifier active period.

Therefore, the role, function, and circuit configuration of the control circuits $33_o$ to $33_j$ of this embodiment are different from those of the first embodiment. In the third embodiment, the control circuits $33_o$ to $33_j$ produce the control signals $CD_q$ which are varied to be fixed to "1" with a predetermined difference of time therebetween during the active period of the amplifiers $32_0$ to $32_7$. During the nonactive period thereof, the controllers create the signals $CD_q$ having data values acquired by the amplifiers $32_o$ and $32_j$. The signals $CD_q$ are sent to the output buffers $34_o$ to $34_j$.

Moreover, the controllers $33_o$ to $33_j$ of the third embodiment function to change the signals $CD_q$ to a fixed value "1" with a preset difference of time therebetween during the active period of the amplifiers $32_0$ to $32_7$. During the nonactive period thereof, the controllers create the signals $CD_q$ which are in phase with the output signals $TD_q$.

The structure of controllers $33_o$ to $33_j$ of the embodiment is the same as that shown in FIG. 11A excepting the data output switch circuit 44 and hence description will be given of the circuit construction of the switch circuit 44. FIG. 18A shows the circuit of the data output switch circuit used in the control circuits $33_o$ to $33_j$ of the third embodiment. As can be seen from FIG. 18A, the circuit 44 includes an inverter 71 which receives the signals $SI_q$ to produce a signal $S_{90}$, a p-channel MOS transistor $T_{P90}$ including a source of the $V_{CC}$ power source, a gate input of the signal $SI_q$, and a drain linked with a node $V_{90}$, a p-channel MOS transistor $T_{P91}$ including a source coupled to the node $V_{90}$, a gate input of the signal $TD_q$, and a drain output of a signal $S_{91}$, an n-channel MOS transistor $T_{N90}$ including a drain input of the signal $S_{91}$, a gate input of the signal $TD_q$, and a source linked with a node $V_{91}$, an n-channel MOS transistor $T_{N91}$ including a drain connected to the node $V_{91}$, a gate input of the signal $S_{90}$, and a source coupled with the GND potential, an n-channel MOS transistor $T_{N92}$ including a drain input of the signal $S_{91}$, a gate input of the signal $SI_q$, and a source coupled with the GND power source, and an inverter 72 which receives the signal $S_{91}$ to produce output buffer control signals $CD_q$.

Subsequently, referring to FIG. 18B showing waveforms of primary signals before, during, and after the sense amplifier active period, description will be given of operation of the data output switch circuit of the third embodiment in accordance with the present invention. When a read operation is commenced and the sense amplifier enable signal TSA2 (FIG. 18B) is altered from "0" to "1", the signals $SI_q$ are changed from "0" to "1" with a difference of time therebetween in a signal-by-signal fashion. In this connection, the signals may be classified into signal groups such that the signal alteration sequentially takes place for each signal group. In FIGS. 18A and 18B, the system includes eight data output signals $D_0$ to $D_7$ and the signals $SI_0$ and $SI_1$ are varied from "0" to "1" with delay of time "0", namely, at initiation of the sense amplifier active period as indicated by $SI_{0,1}$, in FIG. 18B. Similarly, as respectively designated by $SI_{2,3}$, $SI_{4,5}$, and $SI_{6,7}$ in FIG. 18B, the signals $SI_2$ and $SI_3$, $SI_4$ and $SI_5$, and $SI_6$ and $SI_7$ are changed from "0" to "1" with delay of time $t_o$, $2t_o$, and $3t_o$, respectively.

As can be seen from FIG. 18B, the output signals $TD_0$ to $TD_3$ are maintained at "0". During the sense amplifier active period TE, when the control signal TSAL is changed from "0" to "1" to start the data latch active period, the signals $TD_4$ to $TD_7$ are altered from "0" to "1".

In the period TE in which the signal TSA2 is "1", when the data input switch signals $SI_q$ ($SI_0$ to $SI_7$ in the example of FIG. 18B) are set to "1" as above, the transistor $T_{P90}$ receiving the signals $SI_q$ via its gate is nonconductive and the transistor $T_{N92}$ is conductive (FIG. 18A).

Moreover, the phase of the switch signals $SI_q$ is reversed by the inverter 71 to produce an output signal $S_{90}$ having a value of "0" and hence the transistor $T_{N91}$ receiving the signal $S_{90}$ via its gate is nonconductive. Since the transistor $T_{N92}$ is conductive, the drain potential thereof, namely, the signal $S_{91}$ is changed to "0". The phase of signal $S_{91}$ is reversed by the inverter 72 to create output buffer control signals $CD_q$ ($CD_0$ to $CD_7$ in the example of FIG. 18B) of which the data value is "1".

After the period TE is terminated and the input signals $SI_q$ are "0" (FIG. 18B), the transistor $T_{P90}$ is conductive and the transistor $T_{N92}$ is nonconductive, which makes the transistor $T_{N91}$ conductive. Therefore, since a combination of transistors $T_{P91}$ and $T_{N90}$ serves as an inverter, the phase of signal $S_{91}$ is opposite to that of signals $TD_q$, namely, the signals $CD_q$ are in phase with the signals $TD_q$ as shown in FIG. 18B.

The signals $CD_q$ are respectively fed to the output buffers $34_q$. On receiving the signals $CD_q$, the buffers $34_q$ produce, in the output buffer active state, data output signals $D_q$ which are in phase with the control signals $CD_q$. In other words, during the period TE, the signals $D_q$ are changed to "1" with a predetermined difference of time therebetween in a signal-by-signal fashion or for each signal groups, each signal group including a plurality of output signals $D_q$ as above. During the sense amplifier nonactive period, the signals $D_q$ are in phase with the signals $TD_q$, i.e., the data items read from the memory cells.

Next, description will be given of a feature and advantages of the third embodiment. In this embodiment, the data output signals $D_q$ are changed to "1" with a difference of time therebetween during the sense amplifier active period TE. Therefore, the discharge current appearing when a plurality of data output signals $D_q$ are varied from "0" to "1" can be dispersed to thereby prevent the deviation in the $V_{cc}$ power source. Consequently, a first advantage of the third embodiment is to suppress the noise in the power source (deviation in the potential of $V_{cc}$ power source) to prevent operation errors associated with the noise. A second advantage thereof is to prevent operation errors due to the noise without decreasing the read speed.

Fourth Embodiment

Next, description will be given of the fourth embodiment in accordance with the present invention. In the description of the second embodiment, there easily appear noise components in the GND power source and the data values are changed from "1" to "0". In accordance with the fourth embodiment which is a variation of the second embodiment, noise components easily appear in the $V_{cc}$ power source and operation errors occurring when the data values are altered from "0" to "1" are prevented by configuring the control circuits $33_o$ to $33_j$ to gradually alter the output buffer control signals $CD_q$ to "1" during the sense amplifier active period.

Therefore, the role, function, and circuit structure of the control circuits $33_o$ to $33_j$ vary between the fourth and second embodiments.

In the fourth embodiment, the control circuits $33_o$ to $33_j$ produce the control signals $CD_q$ which vary, between the sense amplifier active and nonactive periods, the capacitance of the p-channel MOS transistor of the final stage in each of the output buffers $34_o$ to $34_j$. The controllers further create signals which are "1" during the sense amplifier active period and which are in phase with the data items attained by the amplifiers $32_o$, $32_j$ during the sense amplifier nonactive period. The signals are then supplied to the output buffers $34_o$ to $34_j$.

The role of output buffers $34_o$ to $34_j$ of the fourth embodiment are the same as that of the second embodiment. Namely, in the output buffer active state (i.e., when the enable signal BOB is "0"), the buffers $34_o$ to $34_j$ output data items from the controllers $33_o$ and $33_j$ to an external device.

Subsequently, the controllers $33_o$ to $33_j$ of the fourth embodiment function to create output buffer signals $CD_{0q}$ (q=0 to j respectively corresponding to output buffers $34_o$ to $34_j$) which are "0" during the amplifier active period and which are "1" during the amplifier inactive period. The controllers further produce output buffer signals $CD_{1q}$ which are "1" during the amplifier active period and which are in phase with the output signals $TD_q$ during the amplifier inactive period.

The output buffers $34_o$ to $34_j$ generate, in the output buffer inactive state, the data output signals $D_q$ at an intermediate potential. In the output buffer active state, the buffers output the data output signals $D_q$ which are gradually changed to "1" during the sense amplifier active period and which are in phase with the output signals $TD_q$ during sense amplifier inactive period.

Subsequently, description will be given of the circuit structure of the controllers $33_o$ to $33_j$ and output buffers $34_o$ to $34_j$ of the embodiment. As can be seen from FIG. 19A, the control circuit $33_q$ includes an inverter 74 which receives the signal TSA2 to produce output buffer control signals $CD_{0q}$, an NOR circuit 75 which receives the signals TSA2 and $TD_q$ to produce a signal $S_{102}$, and an inverter 76 which receives the signal $S_{102}$ to create an output buffer control signal $CD_{1q}$.

Figure 19A:
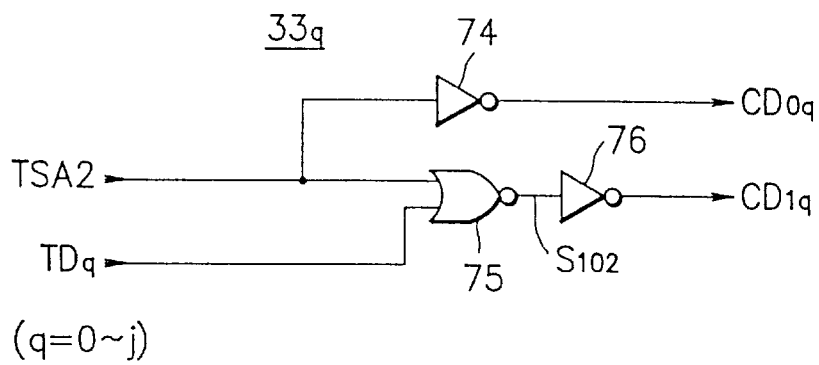
FIGS. 19A and 19B are circuit diagrams respective showing a control circuit and an output buffer in a fourth embodiment in accordance with the present invention.
Figure 20:
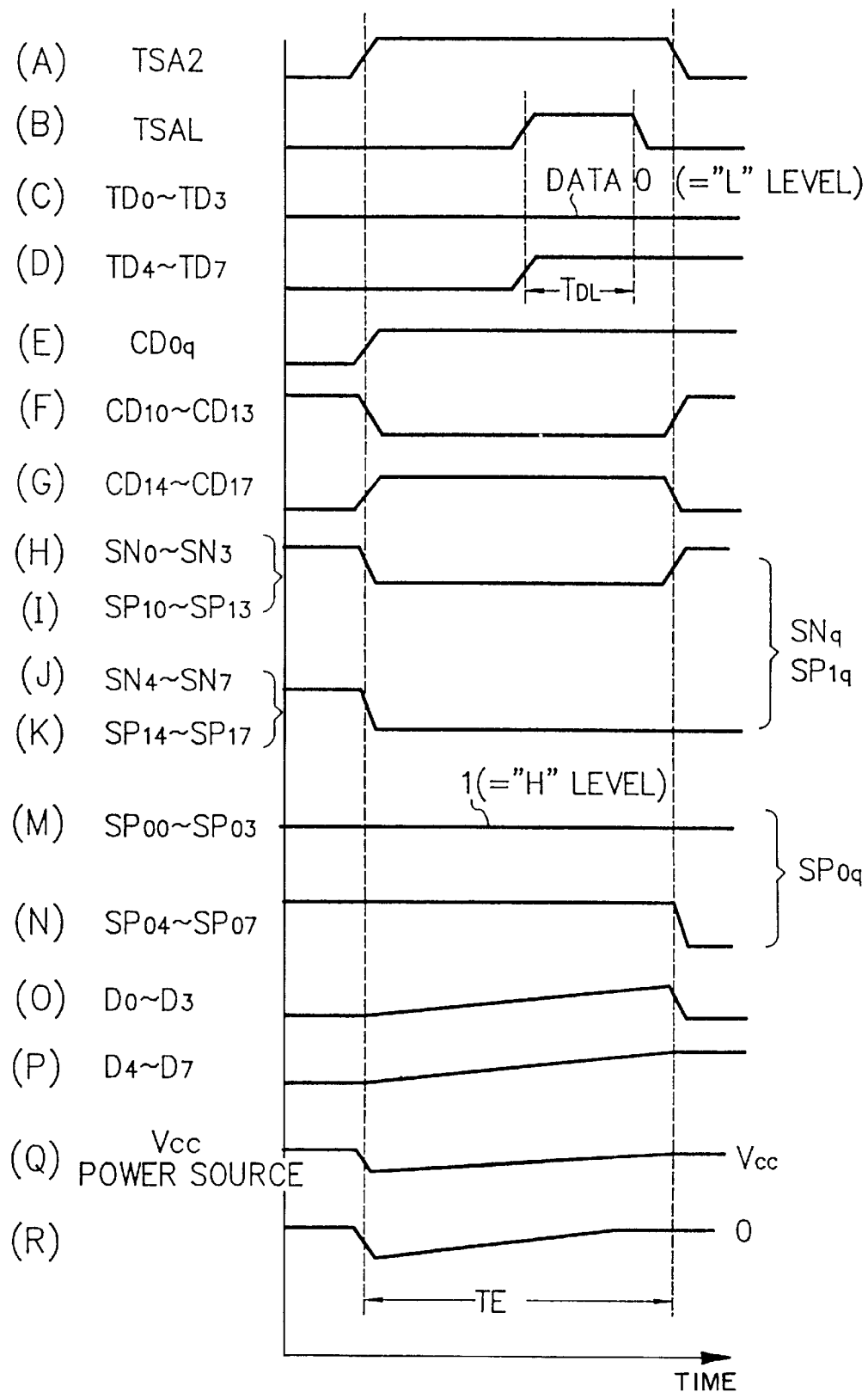
FIG. 20 is a graph showing waveforms for explaining operation of the fourth embodiment in accordance with the present invention.

Referring now to FIGS. 19A and 20, operation of the control circuit $33_q$ will be described. During the sense amplifier active period TE, the signal TSA2 is "1" ((A) of FIG. 20) and hence the control signals $CD_{0q}$ from the inverter 74 of FIG. 19A are "0" ((E) of FIG. 20) and the signal $S_{102}$ from the NOR circuit 75 of FIG. 19A is "0". Therefore, the control signals $CD_{1q}$ are "1" as shown in (F) and (G) of FIG. 20. In this case, the output buffer control signals include two 4signal groups, i.e., $CD_{10}$ to $CD_{13}$ and $CD_{14}$ to $CD_{17}$.

When the period TE is terminated, the signal TSA2 is "0" ((A) of FIG. 20) and hence the signals $CD_{0q}$ are changed to "1" ((E) of FIG. 20). Simultaneously, the phase of signal $S_{102}$ from the NOR circuit 75 is opposite to that of the signals $TD_q$ ((C) and (D) of FIG. 20) and the signals $CD_{1q}$ are in phase with the signals $TD_q$ as shown in (F) and (G) of FIG. 20.

Figure 19B:
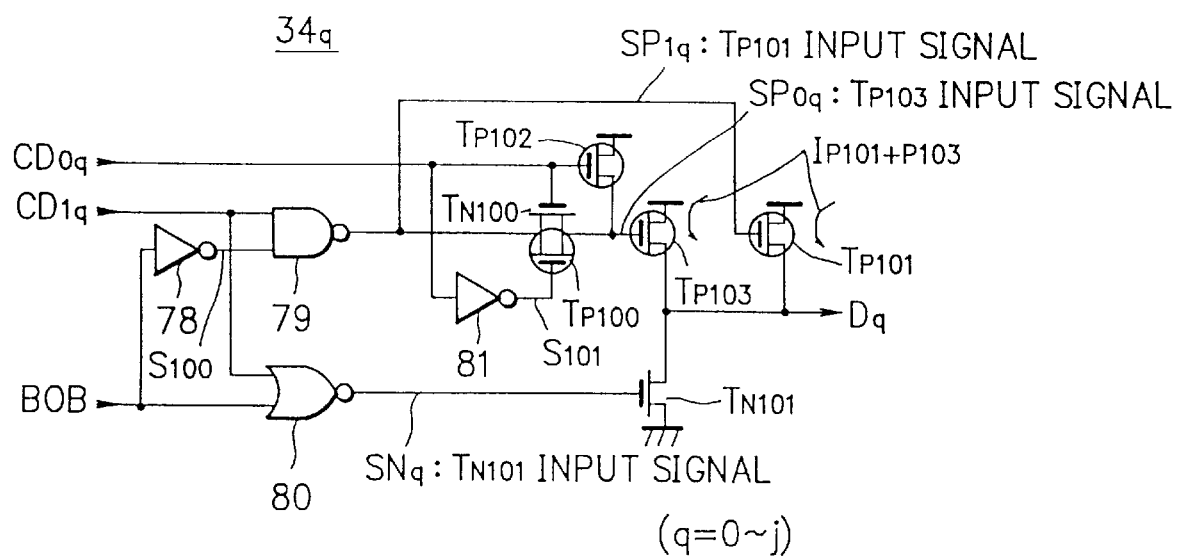

Next, description will be given of the circuit structure of the output buffers $34_q$ ($34_o$ to $34_j$). FIG. 19B shows in a circuit diagram the construction of the output buffers $34_q$ in the fourth embodiment in accordance with the present invention. As can be seen from FIG. 19B, the buffer 34q includes an inverter 78 which receives the signal BOB to create a signal $S_{100}$, an NAND circuit 79 which receives the signals $CD_{iq}$ and $S_{100}$ to generate a signal $SP_{1q}$, an NOR circuit 80 which receives the signals $CD_{1q}$ and BOB to produce a signal $SN_q$, an inverter 81 which receives the signal $CD_{0q}$ to create a signal $S_{101}$, p-channel MOS transistors $T_{P100}$, $T_{P01}$, $T_{P102}$, and $T_{P103}$, and n-channel MOS transistors $T_{N100}$ and $T_{N101}$.

The transistors $T_{P100}$ and $T_{N100}$ configure a transfer gate in which drains and sources are respectively shared therebetween. The transfer gate receives the signal $SP_{1q}$ to generate a signal $SP_{0q}$. The transistor $T_{P102}$ includes a source connected to the $V_{cc}$ potential, a gate input of the signal $CD_{oq}$, and a drain output of the signal $SP_{oq}$. The transistor $T_{P101}$ includes a source linked with the $V_{cc}$ power source, a gate input of the signal $SP_{1q}$, and a drain output of the signal $D_q$. The transistor $T_{P103}$ includes a source coupled with the $V_{cc}$ power source, a gate input of the signal $SP_{0q}$, and a drain output of the signal $D_q$. Additionally, the transistor $T_{N101}$ includes a gate input of the signal $SN_q$, a source connected to the GND potential, and a drain coupled with the drains respectively of the transistors $T_{P103}$ and $T_{P101}$. It is assumed that the total performance of $T_{P103}$ and $T_{P101}$ is substantially the same as that of $T_{P195}$ of the conventional semiconductor device (FIG. 8B).

In the second embodiment, all data output signals Dq are gradually altered to "0" during the sense amplifier active period. In contrast therewith, according to a feature of operation of the output buffers $34_q$ in the fourth embodiment, the data output signals $D_q$ are gradually altered to "1" during the sense amplifier active period such that the data obtained during the active period is outputted when the active period is terminated. However, the output buffers $34_q$ are required, as in the second embodiment, to be enable at initiation of the sense amplifier active period.

Subsequently, operation of the output buffers $34_q$ shown in FIG. 19B will be described by referring to waveforms of primary signals before, during, and after the active period of the output buffers $34_q$. Assume that the output buffer enable signal BOB is "0" and the output buffers $34_q$ are accordingly active. In this situation, the signal $S_{100}$ from the inverter 78 (FIG. 19B) is "1". As described above, the signals $CD_{0q}$ are "0" ((E) of FIG. 20) during the sense amplifier active period TE. The signal $S_{101}$ created by reversing the phase of the signals $CD_{0q}$ via the inverter 81 is "1". Consequently, the transistor $T_{P100}$ is nonconductive, the transistor $T_{N100}$ receiving the signals $CD_{0q}$ via its gate is nonconductive and the transistor $T_{P102}$ is conductive. Therefore, the gate of $T_{P103}$ is connected via $T_{P102}$ to the $V_{cc}$ potential and the signal $SP_{0q}$ is "1", which makes the transistor $T_{P103}$ nonconductive.

On the other hand, since the signals $CD_{1q}$ are "1" during the active period TE as above, the signals $SP_{1q}$ ($SP_{10}$ to $SP_{17}$ in the example of FIG. 20) from the NAND circuit are "0" as shown in (I) and (K) of FIG. 20. The transistor $T_{P101}$ receiving the signals $SP_{1q}$ via its gate is conductive. Similarly, since the signals $CD_{1q}$ are "1", the signals $SN_q$ ($SN_0$ to $SN_7$ in the example of FIG. 20) from the NOR circuit 80 are "0" as shown in (H) and (J) of FIG. 20. The transistor $TN_{101}$ receiving the signals $SN_q$ via its gate is nonconductive.

As described above, the comprehensive performance of $T_{P101}$ and $T_{P103}$ is assumed to be substantially equal to the p-channel MOS transistor ($T_{P195}$ of FIG. 8B) in the final output stage of the conventional semiconductor device. In consequence, during the period TE in which only the transistor $T_{P101}$ is conductive in this embodiment, the capability to raise the data output signals $D_q$ to "1" is less than that of the semiconductor device of the prior art. Therefore, in accordance with the fourth embodiment, during the sense amplifier active period TE, the data output signals $D_q$ ($D_o$ to $D_7$ in the example of FIG. 20) are changed to "1" as shown in (O) and (P) of FIG. 20 in a longer period of time when compared with the conventional semiconductor device.

In this connection, the period of time required to vary the signals $D_q$ to "1" can be arbitrarily changed in accordance with specifications of performance of transistors $T_{P101}$ and $T_{P103}$.

When the active period TE is completed, the signals $CD_{0q}$ are "1" ((E) of FIG. 20) and the signal $S_{101}$ is "0". Consequently, the transistors $T_{P100}$ and $T_{N100}$ are conductive and the transistor $T_{P102}$ is nonconductive.

Additionally, outputted as the signals $CD_{1q}$ are the data items obtained from the memory cells during the period TE, namely, the signals $TD_q$. Therefore, the phase of signals $SP_{1q}$ and $SN_q$ respectively from the NAND and NOR circuits 79 and 80 is opposite to that of the obtained data items (signals $TD_q$) as shown in (H) to (K) of FIG. 20.

In this situation, since the transfer gate including $T_{P100}$ and $T_{N100}$ is conductive, the signal $SP_{1q}$ is delivered as the signal $SP_{0q}$ via the transfer gate. As a result, the phase of signals $SP_{0q}$ is also opposite to the acquired data items (signals $TD_q$) as shown in (M) and (N) of FIG. 20.

In consequence, when the signals attained by inverting the phase of the readout data items are "0", the transistor $T_{N101}$ is nonconductive and the transistors $T_{P101}$ and $T_{P103}$ are conductive. This allows the charge current to flow through the transistors $T_{P101}$ and $T_{P103}$ and hence the signals $D_q$ become "1". On the other hand, when the anti-phase signals attained by inverting the phase of the readout data items are "1", the transistor $T_{N101}$ is conductive and the transistors $T_{P101}$ and $T_{P103}$ are nonconductive. This allows the charge current to pass through the transistor $T_{N101}$ and hence the signals $D_q$ are "0". In short, during the sense amplifier inactive period, the signals $D_q$ have the same logical value as the data items (signals $TD_q$) read from the memory cells and the performance of the final output stage is almost the same as that of the conventional semiconductor.

In the example of FIG. 20, it is assumed that when the signal TSAL is varied during the active period TE from "0" to "1" ((B) of FIG. 20) to commence the data latch active period, the output signals $TD_0$ to $TD_3$ are maintained at "0" ((C) of FIG. 20) and signals $TD_4$ to $TD_7$ are altered from "0" to "1" ((D) of FIG. 20). After the signal TSAL is changed from "1" to "0", the data latch active period $T_{DL}$ is terminated.

In this case, the data output signals $D_0$ to $D_3$ and $D_4$ to $D_7$ are varied as shown in (O) and (P) of FIG. 20 during the active period TE. Consequently, when the period TE is finished, the signals $D_0$ to $D_3$ are altered from "1" to "0", namely, the level of signals $TD_0$ to $TD_3$ ((O) of FIG. 20); whereas the signals $D_4$ to $D_7$ are maintained at "1", i.e., the level of signals $TD_4$ to $TD_7$ ((P) of FIG. 20). The read operation is completed in this way.

Incidentally, in the output buffer inactive state, namely, when the output buffer enable signal BOB is "1", the signals $SP_{0q}$ and $SP_{1q}$ are "1" and the signals $SN_q$ are "0" in FIG. 19B, and hence the transistors $T_{P101}$, $T_{103}$, and $T_{N101}$ are nonconductive and the signals $D_q$ are, as a result, set to an intermediate potential.

As above, in accordance with an aspect of the fourth embodiment of the present invention, the data output signals $D_q$ are gradually varied to "1" during the sense amplifier active period TE such that the data items acquired from the memory cells during the active period are output after the active period is terminated. Since only the transistor $T_{P101}$ is conductive during the period TE, the charge current delivered through the transistor $T_{P101}$ is slowly altered as shown in (R) of FIG. 20. Therefore, when a plurality of data output signals $D_q$ are simultaneously changed from "0" to "1", the peak value of the charge current from the $V_{cc}$ power source can be minimized, which suppresses the variation in the $V_{cc}$ potential to thereby prevent operation errors due to the variation in the $V_{cc}$ power source.

In this connection, as in the second embodiment, the output buffers $34_q$ are required to be enable at the initiation of the sense amplifier active period TE. The fourth embodiment of the present invention has two advantages as follows. A first advantage is to decrease noise components in the source power (fluctuation in the $V_{cc}$ power) to prevent operation errors associated with the noise components. A second advantage is to prevent the operation errors related to the noise without decreasing the read speed.

Embodiment

Another embodiment of the present invention will be next described. Assume in FIG. 14 related to the first embodiment that the sense amplifier active period TE is 30 nanoseconds (ns), the delay time $t_o$ is 5 ns, the data latch standby period $T_s$ is 20 ns, and the data latch active period $T_{DL}$ is 5 ns. Relative to the point of time when the sense amplifier enable signal TSA2 is varied from "0" to "1", the period of time (delay time) necessary for the data output signals $D_0$ to $D_7$ from output buffers $34_0$ to $34_7$ to change from "1" (when the data value is "1" before the change) to "0" is assumed to be as follows. The delay time is "0" for signals $D_0$ and $D_1$, $t_o$ for signals $D_2$ and $D_3$, $2t_o$ for signals $D_4$ and $D_5$, $3t_o$ for signals $D_6$ and $D_7$. In this regard, the delay time $t_o$ is selected so that all signals $D_0$ to $D_7$ are altered to "0" during the data latch standby period Ts.

Subsequently, operation of the embodiment will be described by referring to FIGS. 10, 13, and 14. Assume that the output signals $TD_0$ to $TD_3$ are maintained at "1" and the signals $TD_4$ to $TD_7$ are varied from "1" to "0" ((J) and (K) of FIG. 13). In a read operation, when the signal TSA2 ((A) of FIG. 13) is altered from "0" to "1" in response to enable of the sense amplifiers $32_7$ to $32_7$, the control signals $CD_0$ and $CD_1$ are changed from "1" to "0". Moreover, in relation to the change in the signals $CD_0$ and $CD_1$, the signals $D_0$ and $D_1$ are varied from "1" to "0" ((L) of FIG. 13 and (P) of FIG. 14).

Additionally, when 5 ns lapse, the control signals $CD_2$ and $CD_3$ are altered from "1" to "0". In response thereto, the output signals $D_2$ and $D_3$ are changed from "1" to "0" ((M) of FIG. 13 and (Q) of FIG. 14). Thereafter, when 5 ns lapse, namely, ten nanoseconds after the sense amplifiers are enable, the signals $CD_4$ and $CD_5$ are altered from "1" to "0" and then the signals $D_4$ and $D_5$ are varied from "1" to "0" ((N) of FIG. 13 and (R) of FIG. 14). Similarly, when 15 ns lapse after the initiation of sense amplifiers, the signals $CD_6$ and $CD_7$ are altered from "1" to "0" and then the signals $D_6$ and $D_7$ are varied from "1" to "0" ((O) of FIG. 13 and (N) of FIG. 14). Namely, all data output signals $D_0$ to $D_7$ are changed to be fixed to "0".

When 20 ns lapse after the sense amplifier initiation, the signal TSAL is altered from "0" to "1" ((T) of FIG. 14) to start the data latch active period in which the signals $TD_4$ to $TD_7$ are varied from "1" to "0" ((J) and (K) of FIG. 13). When 5 ns lapse after the change of TSAL from "1" to "0", the data latch active period $T_{DL}$ is terminated.

Furthermore, 5 ns thereafter, the signal TSA2 is changed from "1" to "0" to terminate the sense amplifier active period TE and the signals $CD_0$ to $CD_7$ are varied to data items which are in phase with the signals $TD_0$ to $TD_7$. That is, the signals $CD_0$ to $CD_3$ are varied from "0" to "1", whereas the signals $CD_4$ to $CD_7$ are maintained at "0". Therefore, the signals $D_0$ to $D_3$ are varied from "0" to "1" and the signals $D_4$ to $D_7$ are maintained at "0". At this point, the read operation is terminated. Since the signals $D_0$ to $D_7$ are fixed during the data latch active period $T_{DL}$ and the GND power source is stable, the data items can be appropriately latched.

In the embodiment, when setting the sense amplifier active period TE, the delay time $t_o$, the data latch standby time $T_s$, and the data latch active period $T_{DL}$, considerations have not been given to the delay of signals due to characteristics of transistors and signal wirings. However, when the signal delay is not negligible, it is desirable to set the values of these items above in consideration of the signal delay.

Advantages of the embodiment will be described. Assume in the conventional semiconductor device that when the signals $D_4$ to $D_7$ are simultaneously varied from "1" to "0", the discharge current fed to the GND power source has a peak value of 30 milliampere (mA). In the semiconductor device of the present embodiment, since the signals $D_4$ to $D_5$, and $D_6$ to $D_7$ are altered from "1" to "0" with a difference of time of 5 ns therebetween, the discharge current having a peak value 15 mA appears at an interval of 5 ns to enter the GND power source. Therefore, the fluctuation in the GND potential can be reduced to about one half of that of the conventional semiconductor device.

Figure 9A:
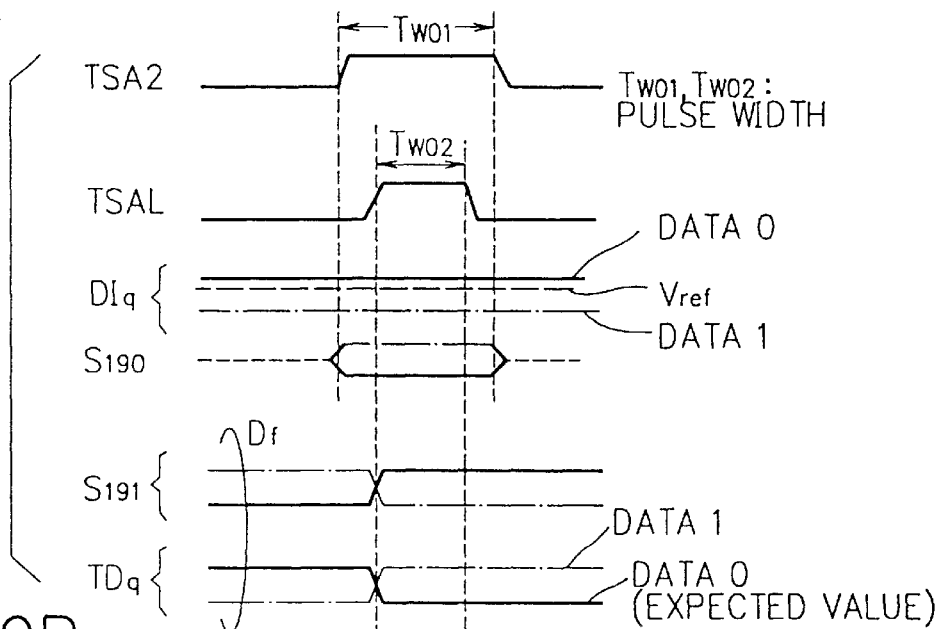
FIGS. 9A to 9C are graphs showing signal waveforms for explaining operation of the conventional sense amplifier and the output buffer.
Figure 9B:
Figure 9C:
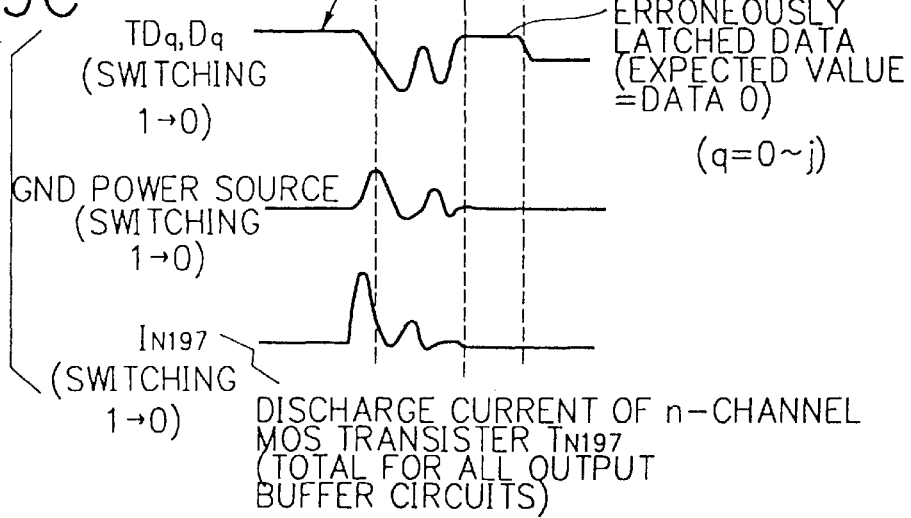

When the signals $D_0$ to $D_7$ are varied from "1" to "0" at the same time, the peak value of discharge current is 60 mA in the prior art. In contrast therewith, the peak value is lowered to 15 mA, i.e., about one quarter of the peak value of the conventional device. Minimization of the discharge current reduces the deviation in the GND potential, which prevents operation errors in the constituent circuit components of the device. For example, the erroneous data read operation and the wrong data latch operation (FIG. 9C) due to an operation failure of the pertinent sense amplifier during the read operation can be prevented. Namely, the read operation can be conducted with high reliability.

The present invention is however not restricted by the embodiments. Namely, in addition to the n-channel and p-channel MOS transistors, there may also be used bipolar transistors as well as various circuit blocks, logical circuits, and elements.

In accordance with the present invention as described above, when a plurality of readout data items are simultaneously changed to a predetermined logical value, the discharge (or charge) current delivered from the final stage of the output circuit is dispersed or the discharge (or charge) current is slowly delivered from the output circuit to minimize the peak value of the discharge (or charge) current. Moreover, the readout data is fed to an external device after the active period of the read circuit is terminated and hence the readout data can be output with the stable GND (or $V_{cc}$) power source. Therefore, it is possible to prevent the fluctuation occurring in the GND power source when a plurality of data output signals are changed from "1" ("H" level) to "0" ("L" level) at the same time (or the deviation occurring in the $V_{cc}$ power source when the data output signals are changed from "0" to "1"). This prevents operation errors and hence improves reliability of the read operation.

Additionally, in accordance with the present invention, the operation errors due to deviation in the GND (or $V_{cc}$) power source can be avoided without decreasing the read speed of data output signals. During the active period of the rad circuit, i.e., before the readout data items are determined, all data output signals are varied to "0" or "1" such that the value is fixed to "0" or "1" only during the active period or the signals are gradually altered to "0" or "1".

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:

1. A semiconductor device comprising:

a plurality of read circuits coupled to a memory device for achieving a memory read operation during an active period thereof, each read circuit receiving a first enable signal having a first logical value during said active period, each read circuit outputting previous readout data until a control signal is input thereto during the active period, and each read circuit outputting readout data thus read from the memory device in response to the control signal;

a plurality of output circuits for receiving as input signals thereto readout data from associated ones of the plurality of read circuits and for receiving a second enable signal and outputting to an external device the readout data input thereto when the second enable signal has a second logical value; and a plurality of control circuits coupled between said read circuits and said output circuits, the control circuits receiving as input signals thereto readout data from the read circuits and the first enable signal, the control circuits forcing the readout data thus input thereto to a third logical value regardless of values of the readout data during a period from a transition of the first enable signal to the first logical value to a point of time when the control signal is input to the read circuits, the control circuits outputting, when the first enable signal transitions to the second logical value, the readout data to the output circuits.

2. A semiconductor device in accordance with claim 1, wherein the plurality of control circuits forces the readout data to a fourth logical value regardless of values of the readout data with a difference of time therebetween or with a difference of time between readout data groups, each data group obtained by classifying the readout data.

3. A semiconductor device in accordance with claim 1, wherein each of the plurality of control circuits includes:

a delay circuit receiving the first enable signal and providing a delayed signal;

a switch signal generating circuit coupled to said delay circuit and generating a switch signal in accordance with the first enable signal and the delayed signal from the delay circuit; and a data output switch circuit coupled to said switch signal generating circuit and receiving as input signals thereto the readout data from the read circuit and the switch signal, said data output switch circuit outputting the data of the third logical value with the delay of time of the delay circuit when the first enable signal has said first logical value, and outputting the readout data when the first enable signal is altered to a logical value different from the first logical value.

4. A semiconductor device in accordance with claim 1, wherein each of said plurality of read circuits include sense amplifiers for reading data from memory cell arrays.

5. A semiconductor device comprising:

a plurality of read circuits coupled to a memory device for achieving a memory read operation during an active period thereof, each read circuit receiving a first enable signal having a first logical value during said active period, each read circuit outputting previous readout data until a control signal is input thereto during the active period, and each read circuit outputting readout data thus read from the memory device in response to the control signal;

a plurality of output circuits for receiving as input signals thereto readout data from associated ones of the plurality of read circuits and for receiving a second enable signal and outputting to an external device the readout data input thereto when the second enable signal has a second logical value; and a plurality of control circuits coupled to said read circuits and said output circuits and generating output circuit control signals in accordance with the readout data from the read circuits and the first enable signal and outputting the output circuit control signals to the output circuits, the control circuits controlling the output circuits by the output circuit control signals such that the output data therefrom is gradually changed to a preset logical value during the active period of the read circuits and the output data has a logical value equal to the value of the readout data from the read circuits after termination of the active period of the read circuits.

6. A semiconductor device in accordance with claim 5, wherein:

each of the control circuits receives as input signals thereto the readout data from the read circuits and the first enable signal and supplies associated ones of the output circuits with a first output circuit control signal which is set to a third logical value during an enable period from a transition of the first enable signal to the first logical value to a subsequent transition to a logical value different from the first logical value; and a second output circuit control signal which has a fourth logical value during the active period and which is changed to a logical value related to the readout data after the enable period is terminated; and each of the output circuits receiving as input signals thereto the first and second output circuit control signals and the second enable signal, and changing the readout data gradually to a fifth logical value during the enable period of associated ones of the read circuits, and each of said output circuits outputting the second output circuit control signal equal to the readout data from the read circuit after the enable period is terminated.

7. A semiconductor device in accordance with claim 6, each of the output circuits comprises:

M output transistors (M is an integer equal to or more than two) mutually connected in parallel to each other for outputting the readout data to said external device when the second enable signal has said second logical value; and a transistor control circuit for setting by the first and second output circuit control signals and the second enable signal a predetermined number (equal to or less than (M−1)) of the output transistors to a conductive state and setting by the second output circuit control signal the M output transistors to a conductive or nonconductive state at the same time in accordance with the logical value of the readout data from the read circuits after the active period of the read circuits is finished.

* * * * *